(12) United States Patent
Jackowski et al.

(10) Patent No.: US 10,717,536 B2
(45) Date of Patent: *Jul. 21, 2020

(54) FLUID ICE PROTECTION SYSTEM FLOW CONDUCTIVITY SENSOR

(71) Applicant: The Boeing Company, Chicago, IL (US)

(72) Inventors: Jason J. Jackowski, Everett, WA (US); Steve G. Mackin, Seattle, WA (US)

(73) Assignee: THE BOEING COMPANY, Chicago, IL (US)

(*) Notice: Subject to any disclaimer, the term of this patent is extended or adjusted under 35 U.S.C. 154(b) by 0 days.

This patent is subject to a terminal disclaimer.

(21) Appl. No.: 16/276,093

(22) Filed: Feb. 14, 2019

(65) Prior Publication Data

US 2019/0176995 A1 Jun. 13, 2019

Related U.S. Application Data

(63) Continuation of application No. 15/639,917, filed on Jun. 30, 2017, now Pat. No. 10,252,808.

(Continued)

(51) Int. Cl.
| | |
|---|---|
| *B64D 15/22* | (2006.01) |
| *B64D 15/20* | (2006.01) |
| *B64D 15/08* | (2006.01) |
| *F04F 5/24* | (2006.01) |
| *F04F 5/14* | (2006.01) |
| *G01R 33/12* | (2006.01) |
| *G01S 17/42* | (2006.01) |
| *G01S 17/88* | (2006.01) |

(Continued)

(52) U.S. Cl.
CPC ............. *B64D 15/22* (2013.01); *B64D 15/08* (2013.01); *B64D 15/20* (2013.01); *F04F 5/14* (2013.01); *F04F 5/24* (2013.01); *G01F 1/58* (2013.01); *G01R 33/1276* (2013.01); *G01S 7/497* (2013.01); *G01S 17/42* (2013.01); *G01S 17/88* (2013.01); *G01S 7/499* (2013.01); *G01S 2007/4977* (2013.01)

(58) Field of Classification Search
CPC ........ B64D 15/22; B64D 15/20; B64D 15/08; G01S 17/42; G01S 17/88; G01S 7/497; G01S 7/499; G01S 2007/4977; F04F 5/24; F04F 5/14; G01F 1/58; G01R 33/1276

See application file for complete search history.

(56) References Cited

U.S. PATENT DOCUMENTS

| 5,523,959 A | 6/1996 | Seegmiller |
|---|---|---|
| 5,589,822 A | 12/1996 | Stern |

(Continued)

FOREIGN PATENT DOCUMENTS

| GB | 2130158 | 5/1984 |
|---|---|---|
| WO | 99/16034 | 4/1999 |
| WO | 9916034 | 4/1999 |

OTHER PUBLICATIONS

Extended European Search Report dated Feb. 2, 2018 for EP application No. 17184132.3.

(Continued)

*Primary Examiner* — Adnan Aziz
(74) *Attorney, Agent, or Firm* — Gates & Cooper LLP

(57) ABSTRACT

Method and system to sense ice protection fluid and verify a Fluid Ice Protection System (FIPS) is distributing the ice protection fluid correctly.

20 Claims, 22 Drawing Sheets

Related U.S. Application Data

(60) Provisional application No. 62/398,382, filed on Sep. 22, 2016.

(51) Int. Cl.
*G01S 7/497* (2006.01)
*G01F 1/58* (2006.01)
*G01S 7/499* (2006.01)

(56) References Cited

U.S. PATENT DOCUMENTS

| | | | |
|---|---|---|---|
| 5,617,076 A | 4/1997 | Stern | |
| 5,709,813 A * | 1/1998 | Janke | C09K 5/20 252/70 |
| 5,760,711 A | 6/1998 | Burns | |
| 5,838,239 A | 11/1998 | Stern et al. | |
| 5,921,501 A | 7/1999 | Pemick | |
| 6,010,095 A | 1/2000 | Hackmeister | |
| 6,052,056 A | 4/2000 | Burns et al. | |
| 6,207,940 B1 | 3/2001 | Feher et al. | |
| 6,286,370 B1 | 9/2001 | Sinha | |
| 6,371,411 B1 | 4/2002 | Breer et al. | |
| 6,416,684 B1 * | 7/2002 | Bloomer | C09K 3/185 252/70 |
| 6,457,676 B1 | 10/2002 | Breer et al. | |
| 6,582,622 B1 * | 6/2003 | Hartley | C09K 3/18 106/13 |
| 6,642,490 B2 | 11/2003 | Feher | |
| 6,688,558 B2 | 2/2004 | Breer et al. | |
| 6,819,265 B2 | 11/2004 | Jamieson et al. | |
| 6,827,873 B2 * | 12/2004 | Hartley | C09K 3/185 106/13 |
| 7,370,525 B1 | 5/2008 | Zhao et al. | |
| 7,439,877 B1 | 10/2008 | Jarvinen | |
| 7,933,002 B2 | 4/2011 | Halldorsson | |
| 7,943,057 B2 * | 5/2011 | Stokes | C09K 3/185 252/70 |
| 8,325,338 B1 | 12/2012 | Pope et al. | |
| 8,462,354 B2 | 6/2013 | Barnes | |
| 8,517,601 B2 | 8/2013 | Stothers et al. | |
| 8,757,551 B2 * | 6/2014 | Margalit | B64D 45/00 239/171 |
| 9,242,735 B1 | 1/2016 | Meis et al. | |
| 9,429,680 B2 | 8/2016 | Grzych et al. | |
| 9,469,408 B1 | 10/2016 | Elangovan et al. | |
| 9,546,004 B1 | 1/2017 | Safai et al. | |
| 9,676,485 B2 | 6/2017 | Stothers et al. | |
| 9,696,238 B2 | 7/2017 | Bosetti et al. | |
| 9,776,731 B1 | 10/2017 | Lieberman et al. | |
| 2004/0036630 A1 | 2/2004 | Jamieson et al. | |
| 2005/0087720 A1 | 4/2005 | Samuels et al. | |
| 2005/0263646 A1 | 12/2005 | Nichols | |
| 2009/0074613 A1 * | 3/2009 | Kaindl | B67D 7/342 422/400 |
| 2010/0328644 A1 | 12/2010 | Lu et al. | |
| 2012/0274938 A1 | 11/2012 | Ray | |
| 2013/0113926 A1 | 5/2013 | Chen et al. | |
| 2013/0320145 A1 | 12/2013 | McGillis et al. | |
| 2014/0055611 A1 | 2/2014 | Wong et al. | |
| 2014/0117106 A1 | 5/2014 | Acheson et al. | |
| 2015/0108233 A1 | 4/2015 | Wright | |
| 2015/0232201 A1 * | 8/2015 | Walsh | B64F 5/23 702/50 |
| 2015/0260099 A1 | 9/2015 | Gally et al. | |
| 2016/0311542 A1 | 10/2016 | Mackin | |
| 2016/0356180 A1 | 12/2016 | Bol | |
| 2017/0008635 A1 | 1/2017 | Mackin et al. | |
| 2017/0057618 A1 | 3/2017 | Khozikov et al. | |
| 2017/0057644 A1 | 3/2017 | Khozikov et al. | |
| 2017/0158336 A1 | 6/2017 | Meis et al. | |
| 2017/0166314 A1 | 6/2017 | Meis et al. | |
| 2017/0166777 A1 | 6/2017 | Berry et al. | |
| 2017/0190431 A1 | 7/2017 | Dichek et al. | |
| 2017/0204291 A1 | 7/2017 | Berry et al. | |
| 2017/0210478 A1 | 7/2017 | Mackin | |
| 2017/0233106 A1 | 8/2017 | Svanebjerg et al. | |
| 2017/0283078 A1 | 10/2017 | Loussides et al. | |
| 2017/0313428 A1 | 11/2017 | Mackin et al. | |
| 2018/0079511 A1 | 3/2018 | Mackin | |
| 2018/0079512 A1 | 3/2018 | Jackowski et al. | |

OTHER PUBLICATIONS

European Application Serial No. 17184132, European Search Report dated Feb. 2, 2018.

* cited by examiner

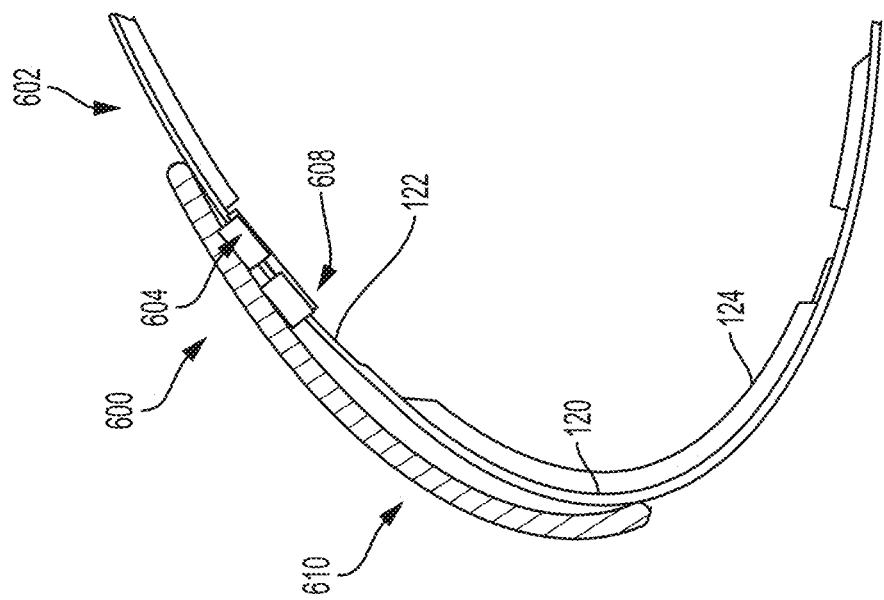
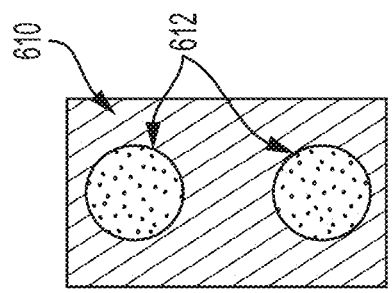
FIG. 6A
FIG. 6B

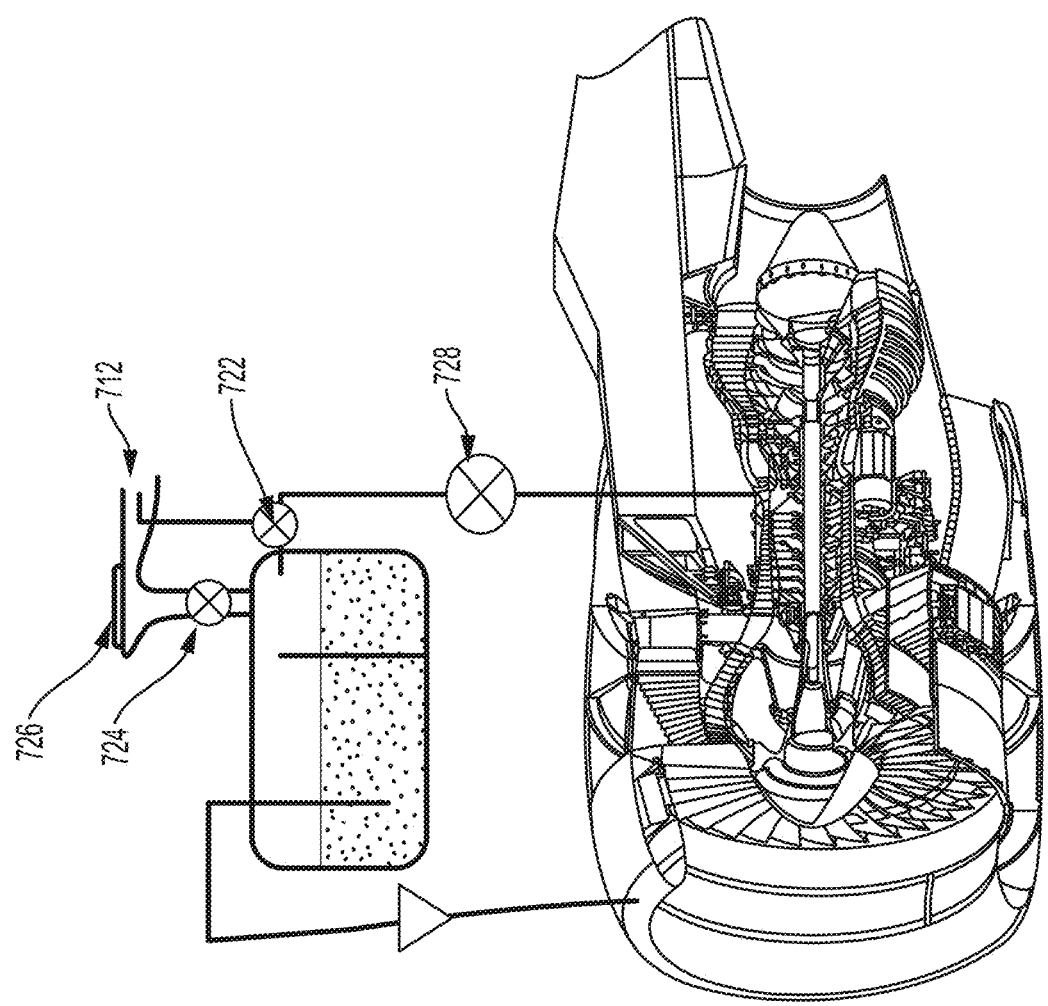

FLUID ICE PROTECTION SYSTEM FLOW CONDUCTIVITY SENSOR

CROSS REFERENCE TO RELATED APPLICATIONS

This application is a continuation under 35 U.S.C. § 120 of and commonly-assigned U.S. Utility patent application Ser. No. 15/639,917 filed on Jun. 30, 2017, by Steve G. Mackin and Jason J. Jackowski, entitled "FLUID ICE PROTECTION SYSTEM FLOW CONDUCTIVITY SENSOR,", which application claims the benefit under 35 U.S.C. Section 119(e) of and commonly-assigned U.S. Provisional Patent Application No. 62/398,382, filed Sep. 22, 2016, by Steve G. Mackin and Jason J. Jackowski, entitled "FLUID ICE PROTECTION SYSTEM FLOW CONDUCTIVITY SENSOR,", both of which applications are incorporated by reference herein.

BACKGROUND

The present disclosure relates to anti-ice systems, and more specifically, to anti-ice systems including sensors that sense the presence of ice protection fluid.

Ice buildup on aerodynamic surfaces of aircraft can be problematic. For example, ice can build up on the leading edges of wings and/or engine nacelles. The ice can also disrupt the intended airflow over the aerodynamic surfaces, causing a loss of lift generated by the aerodynamic surface. A combination of design considerations of modern airfoils and modern certification requirements result in less ice tolerance, meaning that modern aircraft need to have more anti-ice capability than some conventional anti-icing technologies can provide. However, existing anti-ice technologies are complicated and/or expensive.

Generally, aircraft with on-board anti-ice or de-ice capability use systems selected from bleed air systems, Tecalemit-Kilfrost-Sheepbridge (TKS) systems or Freezing Point Depressant (FPD) systems, and pneumatic/mechanical boots. FPD systems are considered the most energy efficient, using a glycol-based fluid that is wept onto the leading edge of an airfoil, an engine nacelle, and/or a spinner for a propeller or fan from a porous panel. The glycol-based fluid mixes with water droplets, lowering the freezing point of the water droplets so that the water droplets cannot freeze. The mixture of glycol-based fluid and water droplets then flow off the aircraft together.

Moreover, to verify the FPD system is functioning properly, a pre-flight inspection is performed with the system on. The system is activated and the porous panels are visually inspected to ensure fluid is flowing properly on all of the panels and all the right places. Visual human inspection is time consuming, messy, and difficult since the ice protected surfaces and porous panels are often far away from a mechanic on the ground and commercial aircraft are large. Moreover, commercial aviation ground crews are busy and adding a visual inspection task that entails activating a system in the cockpit is unacceptable.

What is needed, then, is a solution that indicates the functioning of the anti-ice system in a more efficient manner. The present disclosure satisfies this need.

SUMMARY

The present disclosure describes a system for anti-icing an ice-prone surface of an aircraft, comprising a sensor to indicate presence and detect flow of ice protection fluid on an ice prone surface of the aircraft.

In various examples, an anti-icing system on the ice-prone surface regulates flow of the ice protection fluid on the ice prone surface based on input from the sensor regarding the presence of the ice-protection fluid.

In various examples, the anti-icing system is a Fluid Ice Protection System (FIPS) weeping out ice protection fluid onto ice-prone surfaces. The FIPS includes a porous panel having a weeping portion from which the ice-protection fluid weeps onto the ice-prone surface to remove or prevent ice build-up on the ice-prone surface.

According to one aspect, the sensor comprises a Light Detection and Ranging (LIDAR) system emitting a LIDAR beam. The LIDAR system includes one or more transmitters transmitting the LIDAR beam and one or more receivers receiving the LIDAR beam. The transmitters and the receivers are mounted on the ice-prone surface or in the aircraft's fuselage. The LIDAR system emits the LIDAR beam onto the ice prone surface and/or sweeps the ice-prone surface to measure the presence of the ice protection fluid.

According to one aspect of the LIDAR implementation, the ice protection fluid includes suspended particulates that reflect a specific wavelength of the LIDAR beam back to the LIDAR system, and detection of the specific wavelength by a receiver in the LIDAR system indicates the presence of ice protection fluid.

According to another aspect, the sensor is a metal detector. In one example, the metal detector includes a magnetic field sensor sensing a change in a magnetic field due to the metal particles added into the ice protection fluid. In yet a further example, the magnetic field sensor includes wire loops printed onto an inside of the porous panel, the wire loops sensing a change in the magnetic field.

According to yet another aspect, the sensor is a conductivity sensor comprising electrical contact pairs having their circuit closed when the ice protection fluid makes an electrical pathway between them. In one example, the electrical contact pairs measure impedance and/or voltage between two contact points on the ice-prone surface to differentiate the ice protection fluid from water flowing on the ice-prone surface.

The sensors are positioned at various locations on the aircraft. In one or more examples, the sensing elements are distributed on the ice-prone surface such that one or more of the following can be detected (1) blockage in the flow and the flow rate of the ice protection fluid, (2) weeping of the ice protection fluid from different sections of the porous panel and onto the ice prone surface, (3) unwanted leakage of ice protection fluid from the porous panel, and (4) functioning of the flow meter indicating flow of the ice protection system. In one example, the sensor includes sensing elements integrated on, and positioned downstream from, the weeping portion of the porous panel on the ice prone surface.

As indicated above, the ice protection fluid used in conjunction with the metal detector or the conductivity sensor has one or more properties that are sensed. In one example, metal particles, such as, but not limited to, iron, silver, or gold particles, are added to the ice protection fluid. In a further example, the metal particles are added in the form of a ferrofluid. In yet another example, the metal particles are nanoparticles distributed homogenously in the ice-protection fluid.

In another aspect, an alert system is activated when the anti-icing system is activated and the sensor does not detect the ice-protection fluid to a target level within a specified period of time, so that a non-icing flight condition can be found.

In yet another aspect, an eductor is used to evacuate ice protection fluid from the porous panel using engine bleed air when an unwanted leakage is detected by the sensor.

BRIEF DESCRIPTION OF THE SEVERAL VIEWS OF THE DRAWINGS

Referring now to the drawings in which like reference numbers represent corresponding parts throughout:

FIG. 6A is a cross-sectional schematic of a conductivity sensor mounted on an ice prone leading edge according to various aspects.

FIG. 6B is a schematic of contact points on the conductivity sensor according to various aspects.

FIG. 7G is an illustration of the operation of the FIPS during icing conditions, according to various examples.

DETAILED DESCRIPTION

In the following, reference is made to particular aspects presented in this disclosure. However, the scope of the present disclosure is not limited to specific described aspects. Instead, any combination of the following features and elements, whether related to different aspects or not, is contemplated to implement and practice contemplated aspects. Furthermore, although aspects disclosed herein may achieve advantages over other possible solutions or over the prior art, whether or not a particular advantage is achieved by a given aspect is not limiting of the scope of the present disclosure. Thus, the following aspects, features, and advantages are merely illustrative and are not considered elements or limitations of the appended claims except where explicitly recited in a claim(s).

In aspects described herein, a system for anti-icing a surface (e.g., an aerodynamic surface) of an aircraft is disclosed. The system includes a sensor to indicate presence of ice protection fluid on the surface of the aircraft. The system further includes a anti-icing system on the surface thereafter regulating flow of the ice protection fluid on the surface based on input from the sensor regarding the presence of the ice-protection fluid. In various examples, the aerodynamic surface includes, but it not limited to, a tail, a wing, an engine inlet, or a windshield of an aircraft.

LIDAR Example

Figure 1A:
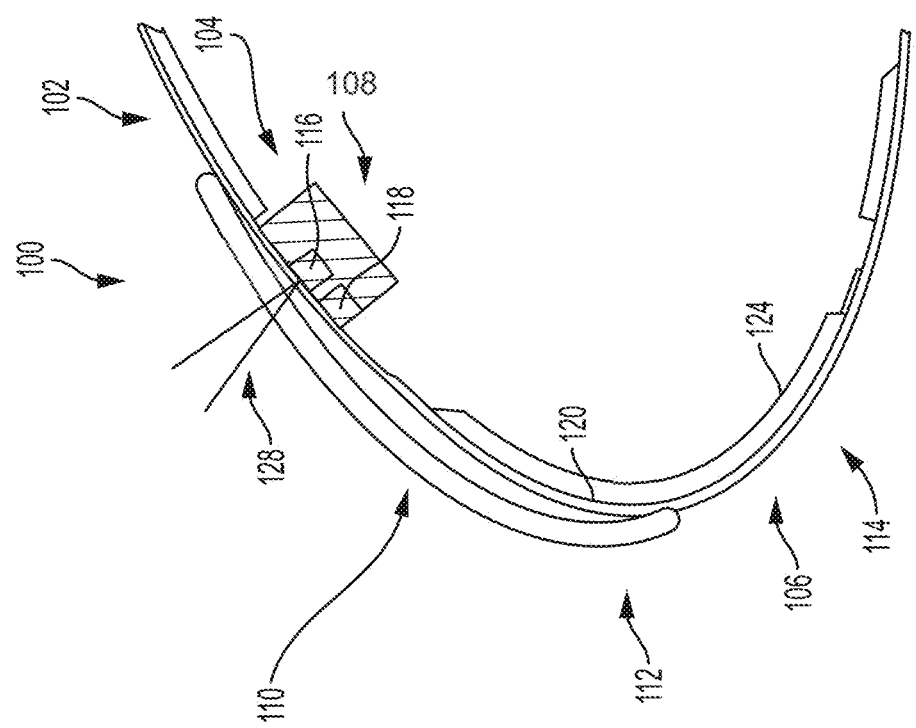
FIG. 1A is a cross-sectional schematic illustrating a LIDAR system installed on an ice prone leading edge according to various aspects.

FIG. 1A illustrates a system 100 for anti-icing an ice-prone surface 102 of an aircraft 204, comprising a sensor 104 and an anti-icing system 106. The sensor 104 includes a LIDAR system 108 indicating presence of ice protection fluid 110 on the ice prone surface 102, wherein the ice prone surface 102 is a leading edge 112 of an aerodynamic surface 114 (e.g., engine inlet on an aircraft nacelle). The LIDAR system 108 includes one or more transmitters 116 and one or more receivers 118 flush mounted at (e.g., one or more key points) along the ice-prone surface 102. FIG. 1A further illustrates the anti-icing system 106 includes a porous panel 122 on the leading edge 112. The porous panel 120 (e.g., porous plastic) has an outer skin 122 and an inner skin 124. The outer skin 122 is laser drilled with pores over an active area. The ice protection fluid 110 with weeps out of from the pores on the leading edge 112 of the outer skin 122. The anti-icing system 106 on the ice-prone surface 102 regulates flow rate of the ice protection fluid 110 on the ice prone surface 102 based on input from the sensor 104 regarding the presence of the ice-protection fluid 110.

Figure 1B:
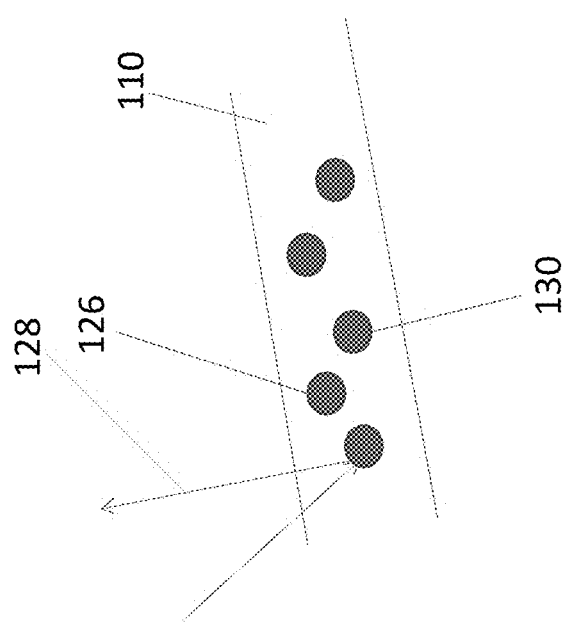
FIG. 1B illustrates suspended particulates added to the ice protection fluid, for use with a LIDAR sensor embodiment.

FIG. 1B illustrates suspended particulates 126 are added to the ice protection fluid 110. The suspended particles 126 reflect a specific and/or known wavelength of a LIDAR beam 128 when excited by the LIDAR beam 128 emitted from the one or more transmitters 116. Detection of the specific and/or known wavelength by the one or more receivers 118 in the LIDAR system 108 detects the particulates 126 in the ice protection fluid 110 thereby indicating the presence of ice protection fluid 110.

In one or more examples, the LIDAR system 108 is a device wholly contained in one unit where the particles 126 are detected. In various other examples, the transmitter 116 and receiver 118 are located on the aerodynamic surface 114 and the computational component and/or laser generator for the LIDAR system 108 are located elsewhere.

Figure 2:
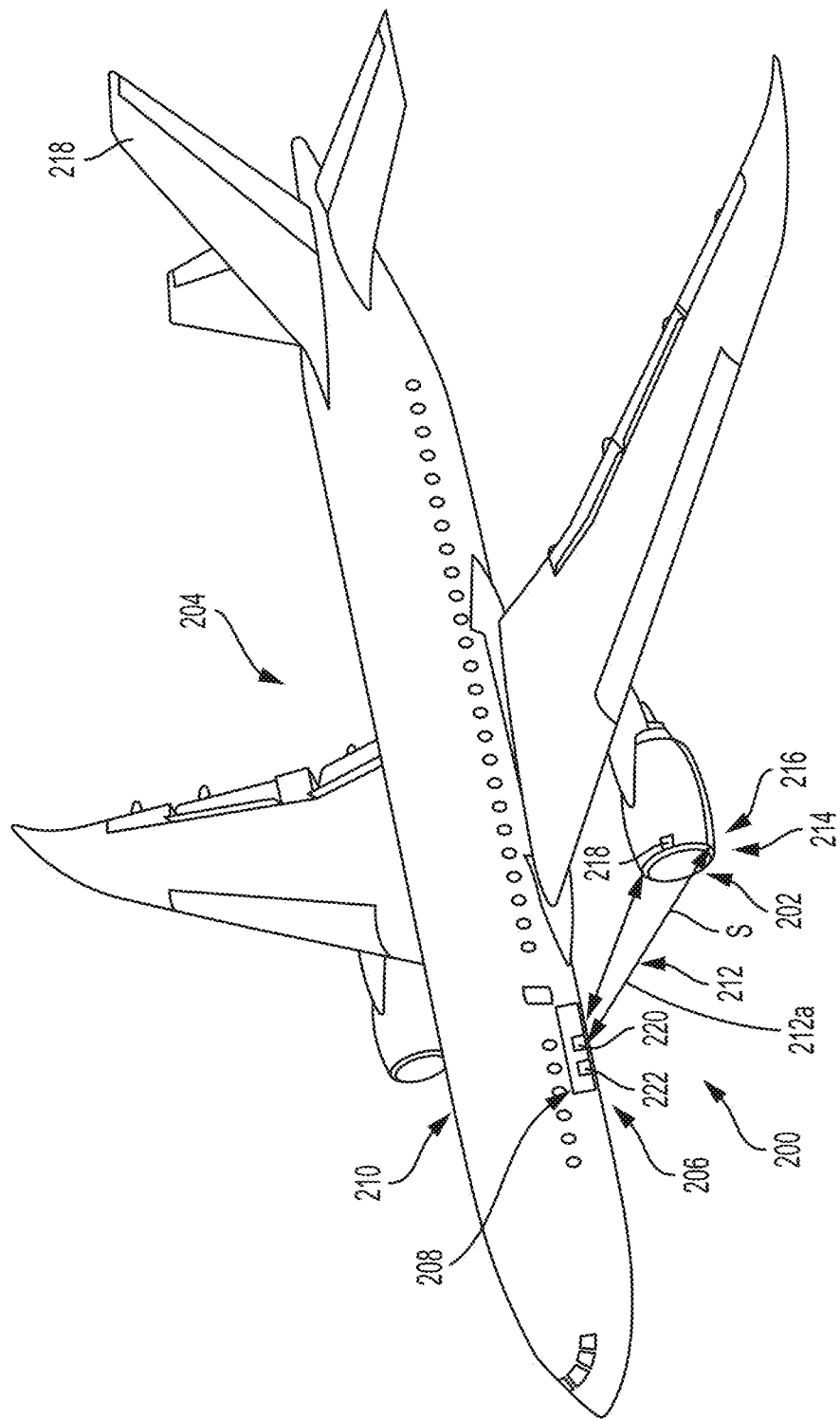
FIG. 2 is a schematic of a LIDAR system installed to sweep an ice-prone engine inlet according to various aspects.

FIG. 2 illustrates another system 200 for anti-icing an ice-prone surface 202 of an aircraft 204, comprising a sensor 206 including a LIDAR system 208 mounted in the aircraft's 204 fuselage 210. The LIDAR system 208 emits the LIDAR beam 212 sweeping S the ice-prone surface 202 of an engine inlet 214 (of a nacelle 216) to measure the presence of the ice protection fluid 218 on the ice prone surface 202 and determine if the ice protection fluid 218 is flowing on the ice prone surface 202. The LIDAR beam 212 detects the presence of the ice protection fluid 218 by measuring the presence of the particles 126 in the ice protection fluid 218 from the LIDAR beam's 212 backscatter 212a. The LIDAR system 208 comprises a transmitter 220 transmitting the LIDAR beam 212 and a receiver 222 receiving the backscatter 212a of the LIDAR beam 212 off the ice prone surface 202.

Figure 3:
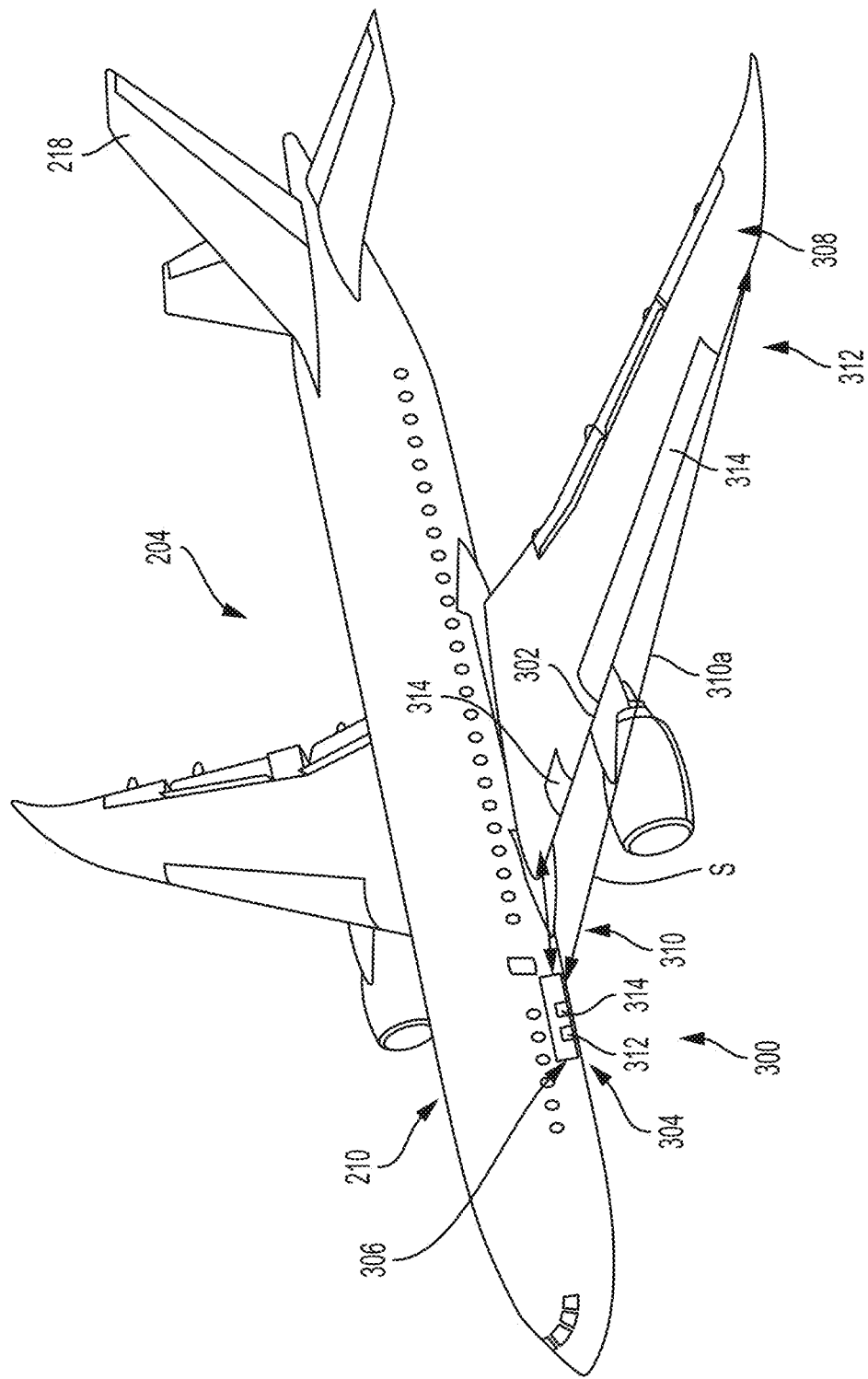
FIG. 3 is a schematic of a LIDAR system installed to sweep an ice-prone wing leading edge according to various aspects.

FIG. 3 illustrates another system 300 for anti-icing an ice-prone surface 302 of an aircraft 204, comprising a sensor 304 including a LIDAR system 306 mounted in the aircraft's 204 fuselage 210, wherein LIDAR system 306 emits the LIDAR beam 310 sweeping S the ice-prone surface 302 of a wing leading edge 312, to measure the presence of the ice protection fluid 314 and determine if the ice protection fluid 314 is flowing on the ice prone surface 302 of the wing 308. The LIDAR system 306 has a longer focal length than the LIDAR system 108 illustrated in FIG. 1B. The LIDAR beam 310 detects the presence of the ice protection fluid 314 by measuring the presence of the particles 126 in the ice protection fluid 314 from the LIDAR beam's backscatter 310a. The anti-icing system 314 on the ice-prone surface 302 regulates flow rate of the ice protection fluid 314 on the ice prone surface 302 based on input from the sensor 304 regarding the presence of the ice-protection fluid 314.

In one example, if the anti-ice system 106, 314 is activated and the LIDAR system 108, 306 does not detect the suspended particulates 126 within a specified time, the LIDAR system 108, 306 sends the flight crew a warning and the crew can then try to find non-icing flight conditions. In one example, the warning is an EICAS message.

Metal Detector Example

Figure 4A:
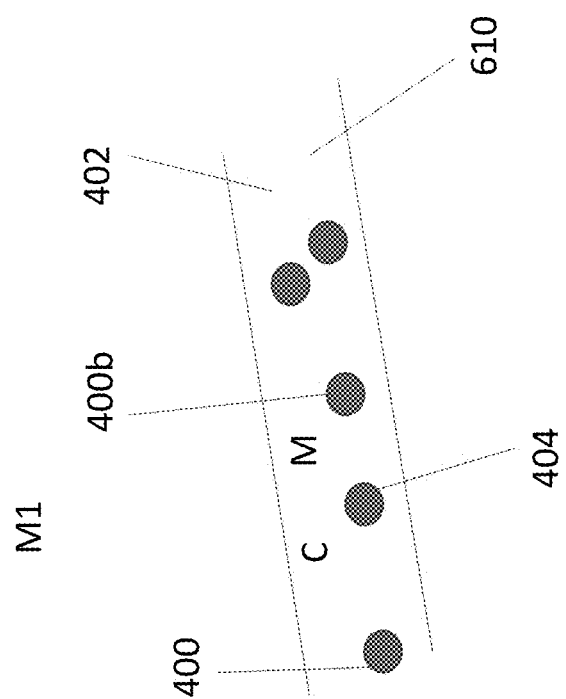
FIG. 4A illustrates metal particles added to the ice protection fluid, for use with a metal detector or conductivity sensor embodiment.

In a metal detector example, metal particles 400 are added to the ice protection fluid 402, as illustrated in FIG. 4A, and the sensor is a metal detector sensing flow of the metal particles in the ice-protection fluid.

Figure 4B:
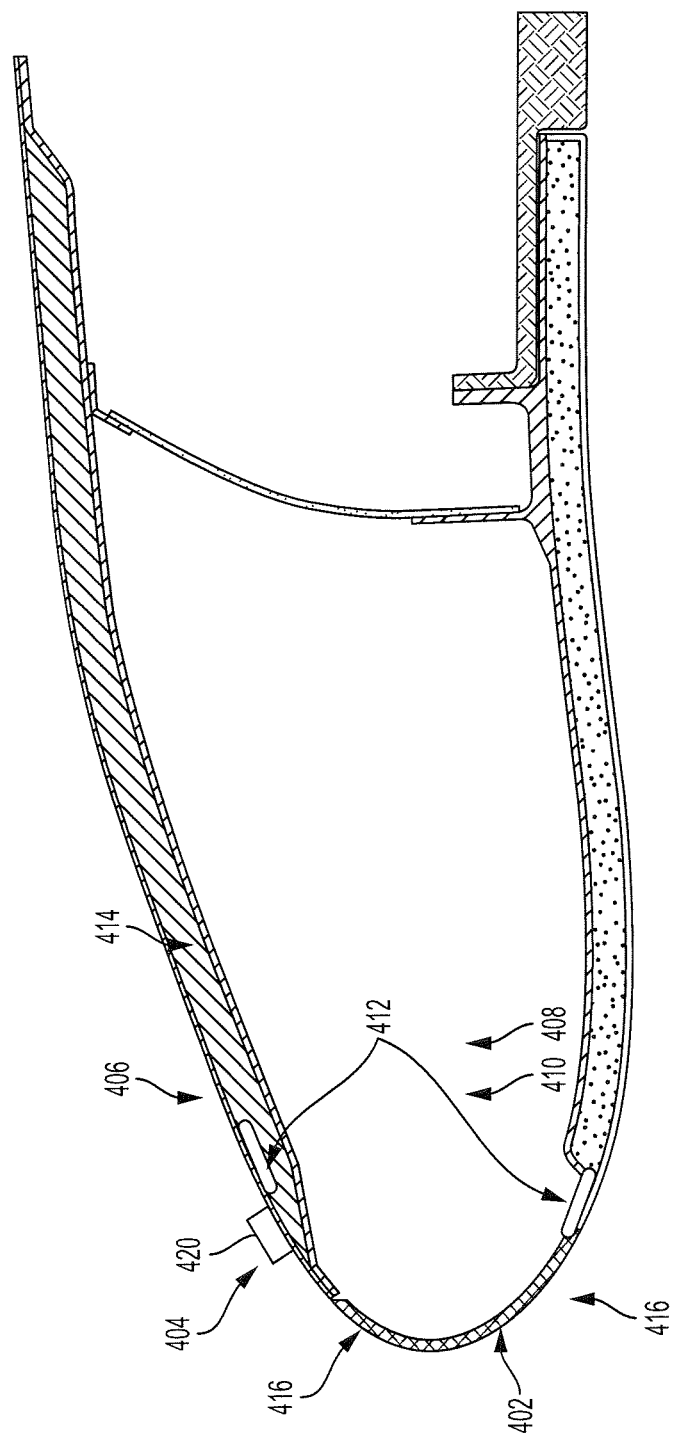
FIG. 4B is a cross-sectional schematic illustrating metal detector sensors mounted at locations (e.g., 360 degrees) around an engine inlet according to various aspects.

FIG. 4B illustrates a system 404 for anti-icing an ice-prone surface 406 of an aircraft 204, comprising a sensor 408, wherein the sensor 408 is a metal detector 410 including sensing elements 412 integrated on a panel 414 on the ice-prone surface 406. In various examples, the sensors 412 are at locations 360 degrees around an engine inlet 214. The anti-ice system 416 includes the panel 414 having a weeping portion (a porous panel 418) from which the ice-protection fluid 402 weeps or is distributed onto the ice-prone surface 406 to remove or prevent ice build-up 420 on the ice-prone surface 406. The sensing elements 412 are positioned downstream from the porous panel 418. Metal particles 400 are added to the ice protection fluid 402 and the metal detector 410 senses flow of the metal particles 400 in the ice-protection fluid 402. In one example, the metal detector 410 includes a magnetic field sensor sensing a change in a magnetic field due to the metal particles 400. In another example, the sensing elements 412 are wire loops printed onto an inside of the panel 414 and the wire loops sense a change in magnetic field due to flow of the metal particles 400 (e.g., iron particles) in the ice protection fluid 402.

Figure 5:
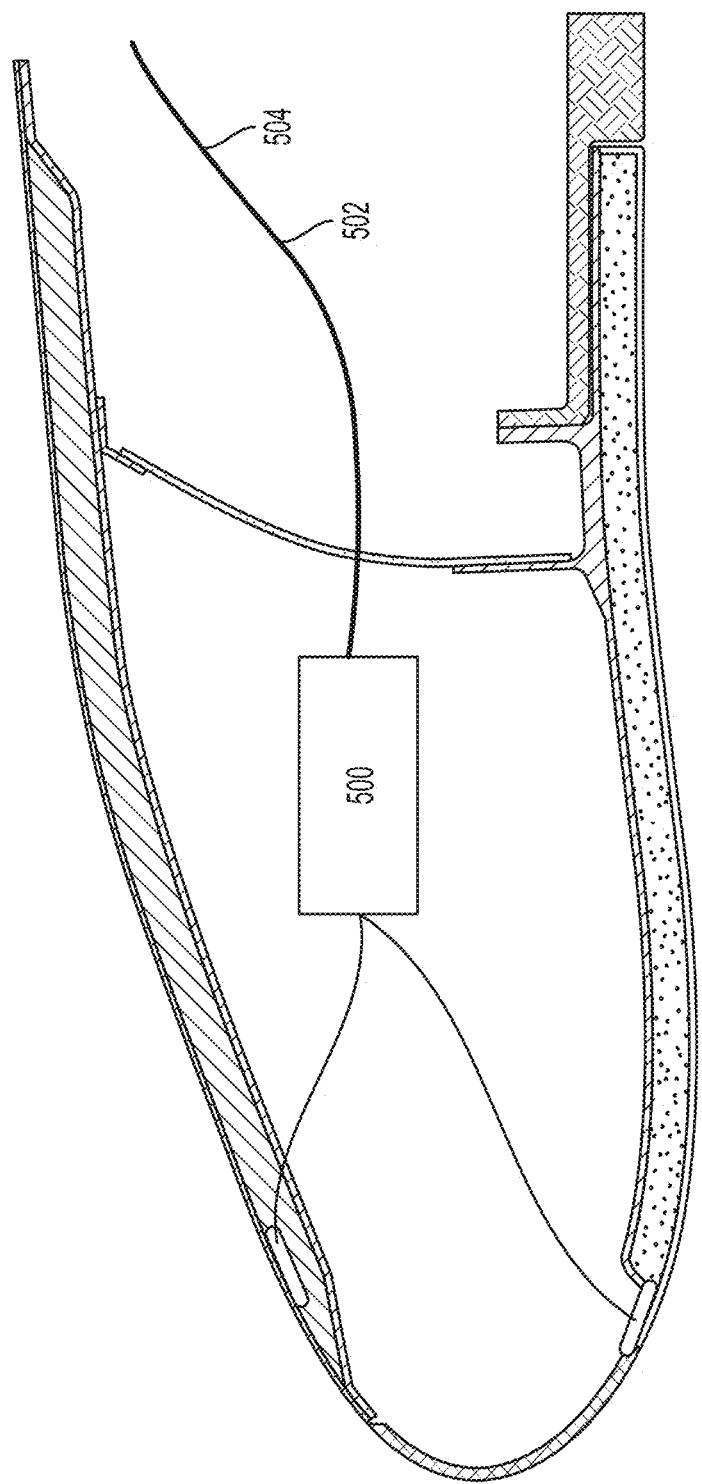
FIG. 5 is a cross sectional schematic illustrating a metal detection device connected to the sensors on an engine inlet and outputting a flow detection signal to a FIPS control system according to various aspects.

FIG. 5 illustrates an example wherein the sensing elements 412 are connected to a metal detection device 500. When the ice protection fluid 402 is flowing over the sensing elements 410 (e.g., wire loops), the sensing elements 412 output detection signals to the metal detection device 500 indicating the presence of a moving particle 400. The metal detection device 500 then outputs a flow detection signal 502 through wires 504 to the anti-icing system 424 verifying whether the anti-icing system 416 is functioning properly. In various examples, the flow detection signal 502 is outputted to a FIPS control system.

Conductivity Detector Example

FIG. 6A and FIG. 6B illustrate an example system 600 for anti-icing an ice-prone surface 602 of an aircraft 204, comprising a sensor 604 and an anti-ice system 606, wherein the sensor 604 includes one or more electrical contact pairs 608 having their circuit closed when the ice protection fluid 610 makes an electrical pathway between them. The one or more contact pairs 608 each include contact points 612 on the ice prone surface 602. A voltage and/or impedance measuring device is used to measure impedance and/or voltage between two contact points 612 on the ice-prone surface 602, thereby determining if the ice protection fluid 610 is covering the ice-prone area and/or weeping out of the porous panel 122 on the leading edge 112 of the aerodynamic surface 614. In one instance, several of the contact pairs 608 are distributed on critical ice-prone areas to adequately determine if the anti-icing system 606 (ice protection system) is working. In another example, the impedance and/or voltage between the contact points 612 is measured by the electrical contact pairs 608 to differentiate the ice protection fluid 610 from water flowing on the ice-prone surface 602. In yet another example, the ice protection fluid 610 includes metal particles 400b (e.g., ferro-fluid particles) that increase conductivity of the ice-protection fluid 610. The use of ferro-fluid is useful if the contact points 612 are not very sensitive or the conductivity sensor 604 would otherwise have difficulty distinguishing between water and the ice protection fluid 610.

Thus, FIGS. 4A, 4B, 5, 6A-6C illustrate a sensor 408, 604 indicating presence of ice protection fluid 402, 610, on an ice prone surface 406, 602 of an aircraft 204; and an anti-icing system 416, 606 on the ice-prone surface 406, 602 regulating flow rate of the ice protection fluid 402, 610 on the ice prone surface 406, 602 based on input from the sensor 408, 604 regarding the presence of the ice-protection fluid 402, 610.

Example Fabrication

In various aspects, the ice protection fluid includes antifreeze, anti-ice fluid, or anti-icing fluid, which are defined as fluids that remove or prevents build up of ice. An example of such a fluid, includes, but is not limited to, a glycol based fluid.

In various aspects, the ice protection fluid is combined with an additive, wherein the additive modifies a conductivity and/or a magnetic property of the ice protection fluid such that a presence of ice protection fluid can be sensed.

In one example, a method of fabricating the ice protection fluid used with the metal detector and the conductivity detector comprises seeding the ice protection fluid with metal particles, including, but not limited to, iron, silver, and gold. As used herein, metal particles include, but are not limited to, nanoparticles, nanosized particles, or microparticles. In one example, the fabrication comprises adding a quantity of ferrofluid (including, e.g., ferrous particles) to the ice protection fluid. In one instance, the method further comprises mixing the ice protection fluid until the ice protection fluid is homogenized. Homogenization ensures the nanoparticles are suspended throughout the ice protection fluid.

In various aspects, one or more metal detectors are printed onto a surface below the flowing ice protection fluid to detect the ice protection fluid seeded with metal particles flowing over the metal detectors. In one example, small (e.g., smaller than a dime but bigger than a diameter of a push pin) loops of wire are printed onto/inside the porous panel to form the magnetic sensors. In one or more examples, Direct-Write technology is used to print the detectors (e.g., wire loops).

In a further example, pure ferrofluid is inserted into the porous panel and the ferrofluid is sensed using the sensors to check the functioning of the sensor.

Example Anti-icing Systems

First Example

Figure 7A:
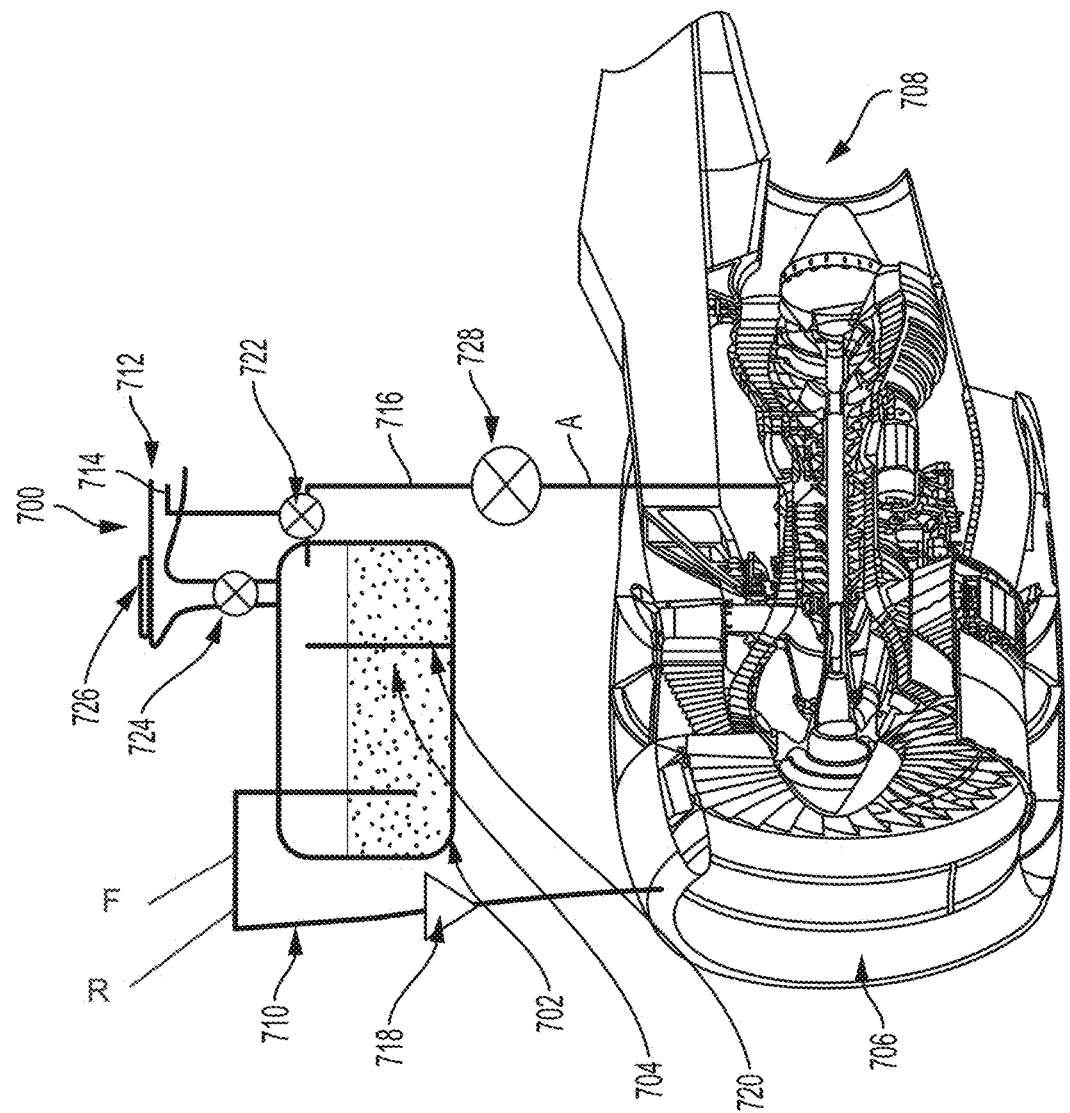
FIG. 7A is a schematic of a turbofan engine FIPS according to various aspects.

FIG. 7A illustrates a FIPS 700 including a tank 702 containing ice protection fluid 704; a porous panel 706 including a porous lip skin of an engine inlet on a turbofan engine 708; a conduit 710, such as a fluid pick up line; and an eductor 712.

In various examples, the porous lipskin comprises a porous membrane.

The conduit 710 delivers the ice protection fluid 704 from the tank 702 to the porous panel 706 under pressure from engine bleed air when the tank 702 is pressurized by the engine bleed air. In one instance, the tank 702 is a pressurized composite tank. The conduit 710 extracts the ice protection fluid 704 from the porous panel 706 into the tank 702 under suctioning from the eductor 712 when the eductor 712 is connected to the tank 702 and the engine bleed air flows through a nozzle 714 (e.g., the bleed air flows supersonically through the nozzle) in the eductor 712. In various examples, the conduit 710 is a plastic tube.

The system further includes a second conduit 716 delivering the engine bleed air A from the high pressure compressor in the engine 708. In various examples, the engine bleed air is obtained from a bleed air system such a manifold. In various examples, the second conduit 716 is a stainless steel pipe. In various examples, the stainless steel pipe has a ⅜ inch diameter.

The system further includes a flow meter 718 (measuring flow rate of the ice protection fluid 704 in the conduit 710) and a fluid level sensor 720. In one example, the flow meter 718 is a displacement flow meter. In various examples, the ice protection fluid flows to the porous panel in the conduit comprising multiple fluid pick up lines and multiple flow meters.

The system further includes a first valve 722 switching the flow of the engine bleed air between the tank 702 and the eductor 710 and a second valve 724 regulating the flow of the ice protection fluid between the tank 702 and the eductor 710. In one instance, the valves 722-724 are solenoid valves. In another instance, the first valve 722 is a three way two position solenoid (SOL) valve as illustrated in FIG. 7B and the second valve 724 is a solenoid on/off valve.

Figure 7C:
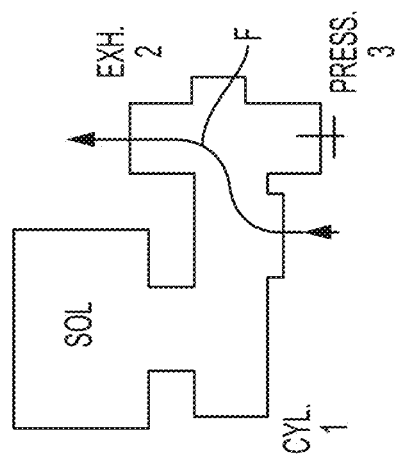
FIGS. 7B-7C is a schematic of a 3-way two position solenoid valve used in the FIPS of FIG. 7A according to various aspects.
Figure 7B:
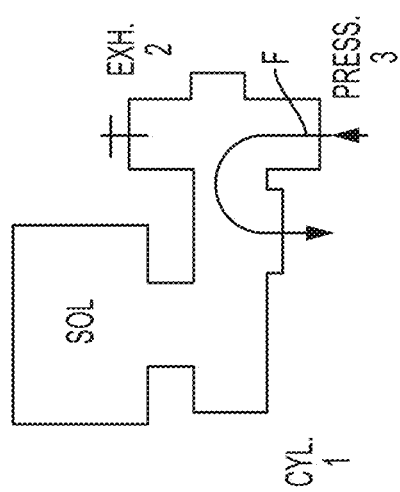

FIGS. 7B-7C illustrate operation of an example normally open solenoid on/off valve 724. When the solenoid (Sol) is de-energized, pressure (press) from the engine bleed air allows the engine bleed air to flow F through the valve cylinder (cyl) to the first valve 722 (FIG. 7B). When the solenoid (Sol) is energized, pressure (press) from the engine bleed air is blocked and cannot enter the cylinder (cyl) and flow in the second conduit 716 is connected to an exhaust (exh) (FIG. 7C).

Ice protection fluid 704 is replenished through a fill cap 726 on the eductor 712.

The system further includes a third valve 728 regulating the flow of the engine bleed air into the tank (e.g., using pressure). In one example, the valve is a pressure regulating shut off valve (PRSOV).

Filling the Tank

Figure 7D:
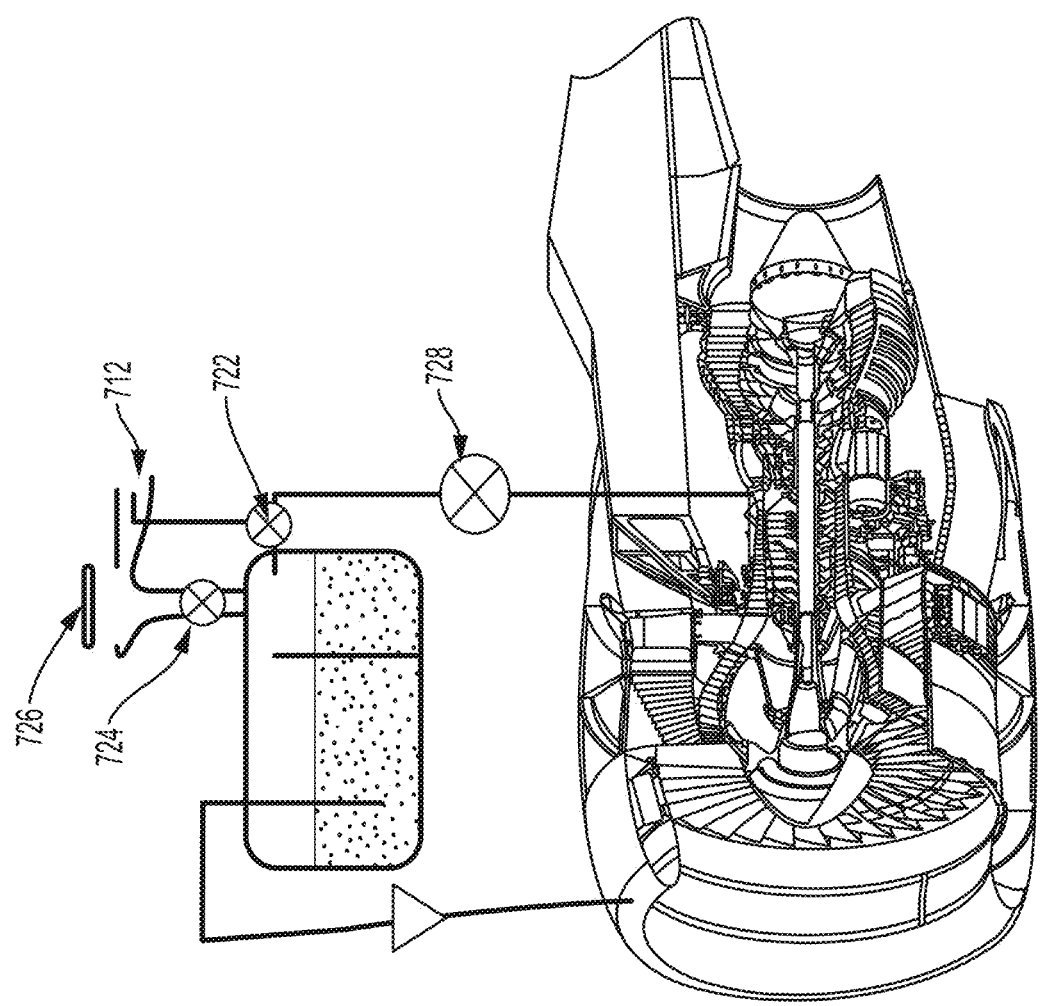
FIG. 7D is an illustration of filling the tank of the FIPS according to various examples.

FIG. 7D illustrates the FIPS operating to fill the tank 702 with anti-ice fluid. The fill cap 726 is off, the second valve 724 is open, the third valve 728 is closed (closing off the engine bleed air), and the first valve 722 is switched to open the second conduit to the eductor. Anti-ice fluid is poured into the tank through the second valve. The eductor 712 is off.

Charging Panels

Figure 7E:
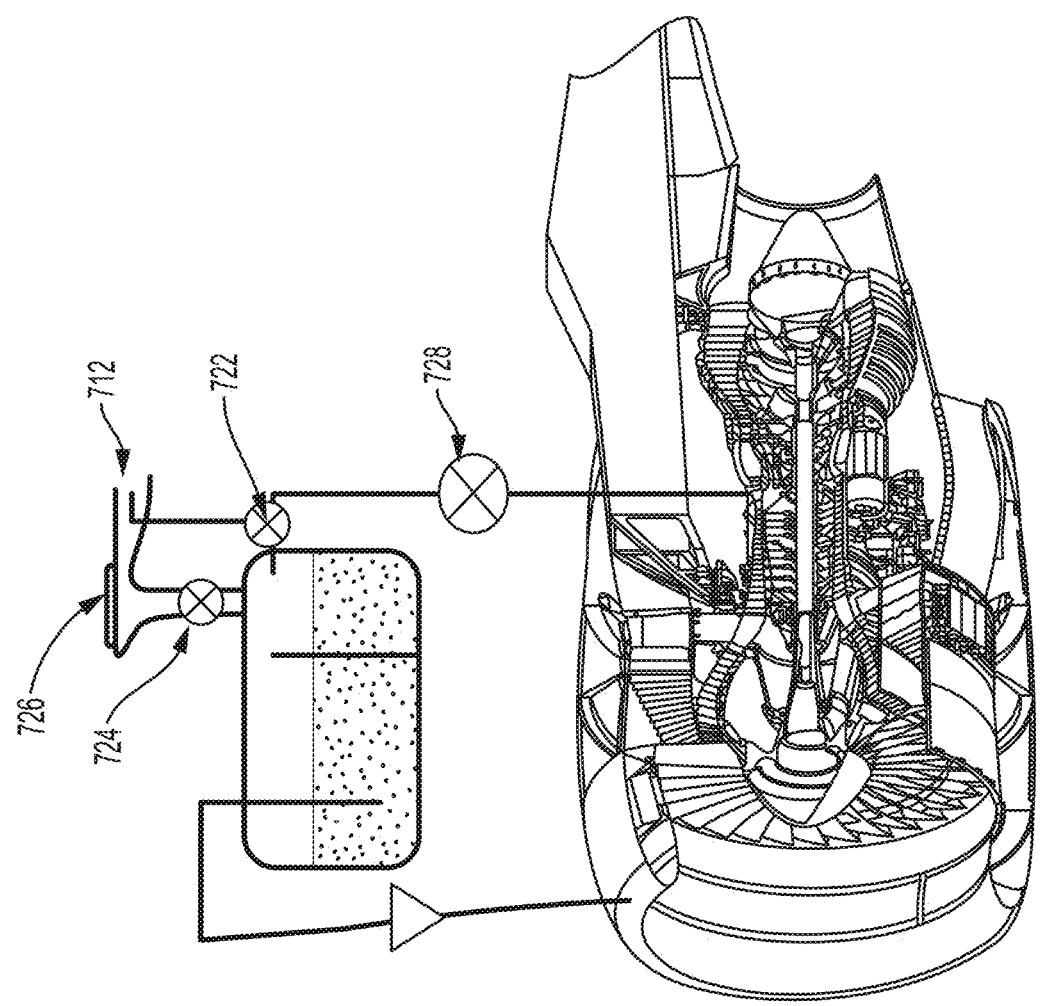
FIG. 7E is an illustration of charging the panels of the FIPS according to various examples.

FIG. 7E illustrates the FIPS operating to charge the porous panels after starting the engine. The system is run in this mode until the porous panel in the engine lip is charged. The fill cap 726 is closed, the second valve 724 is closed, the third valve 728 is open (regulating the flow of engine bleed air during starting), and the first valve 722 is switched to open the second conduit 716 to pressurize the tank with the engine bleed air. The second conduit 716 delivers the engine bleed air from the high pressure compressor in the engine 708 to pressurize the tank and the conduit 710 delivers the ice protection fluid 704 from the tank 702 to the porous panel 706 under pressure from the engine bleed air. The eductor 712 is off.

Operation in Non-Icing Conditions

Figure 7F:
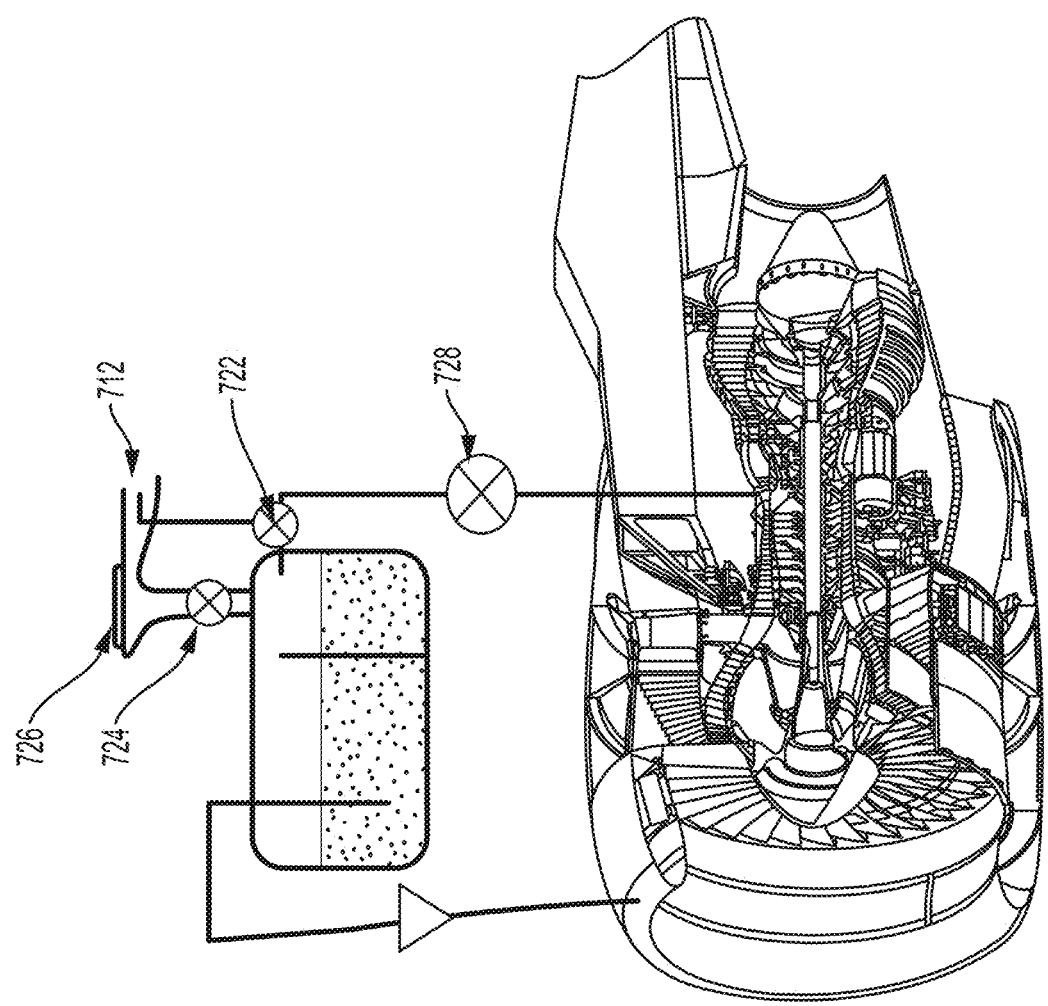
FIG. 7F is an illustration of the operation of the FIPS during non-icing conditions, according to various examples.

FIG. 7F illustrates the FIPS operating in a non-icing condition. The fill cap 726 is closed, the second valve 724 is closed, the third valve 726 is closed (closing off the engine bleed air while the engine is running), and the first valve 722 is switched to open the second conduit to the eductor. The eductor 712 vents leakage in the third valve 728 (third valve 728 is closed and the engine 708 is running).

Operation in Icing Condition

FIG. 7G illustrates the FIPS operating in an icing condition during flight or on the ground. The fill cap 726 is closed, the second valve 724 is closed, the third valve 728 is open (regulating the flow of engine bleed air to achieve fluid flow rate while the engine 708 is running), and the first valve 722 is switched to open the second conduit to pressurize the tank with the engine bleed air. The conduit 710 delivers the ice protection fluid from the tank to the porous panel under pressure from the engine bleed air. The eductor 712 is off. Ice protection fluid is flowing to the lip 706 through one or more pick up lines 710 and one or more flow meters 718.

Operation in Non-Icing Condition after Landing

Figure 7H:
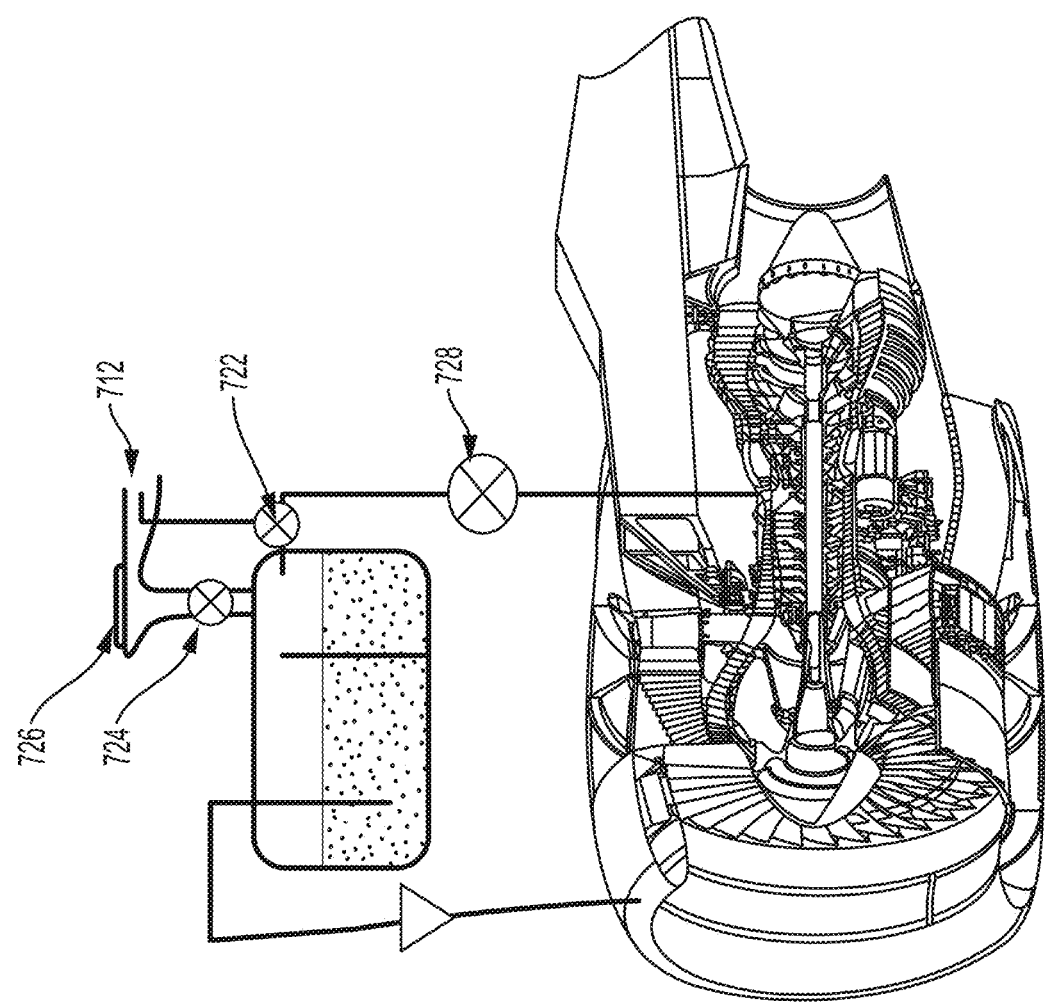
FIG. 7H is an illustration of the operation of the FIPS during non-icing conditions after landing, according to various examples.

FIG. 7H illustrates the FIPS operating after touch down in a non-icing condition. The fill cap 726 is closed, the second valve 724 is open, the third 728 valve is open (regulating the engine bleed air to choke the eductor 712), and the first valve 722 is switched to open the second conduit 716 to the eductor. The conduit 710 extracts the ice protection fluid from the porous panel into the tank 702 under suctioning from the eductor 712 (eductor 712 on). The system is run in this mode until the fluid flow meter stops indicating flow.

FIPS Engine Inlet Integration

Figure 7J:
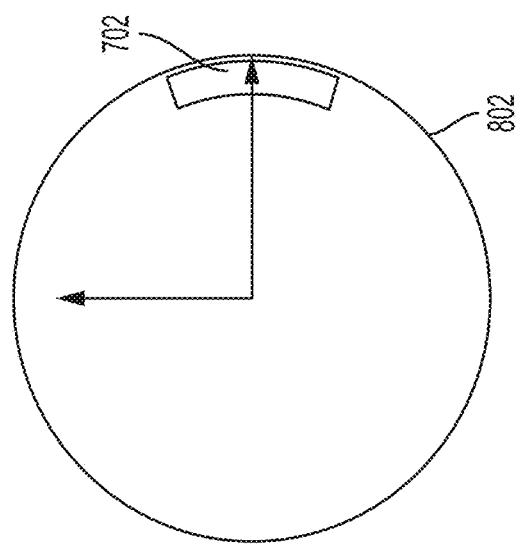
FIG. 7J illustrates the position of the tank looking aft at the engine inlet, according to various examples.
Figure 7I:
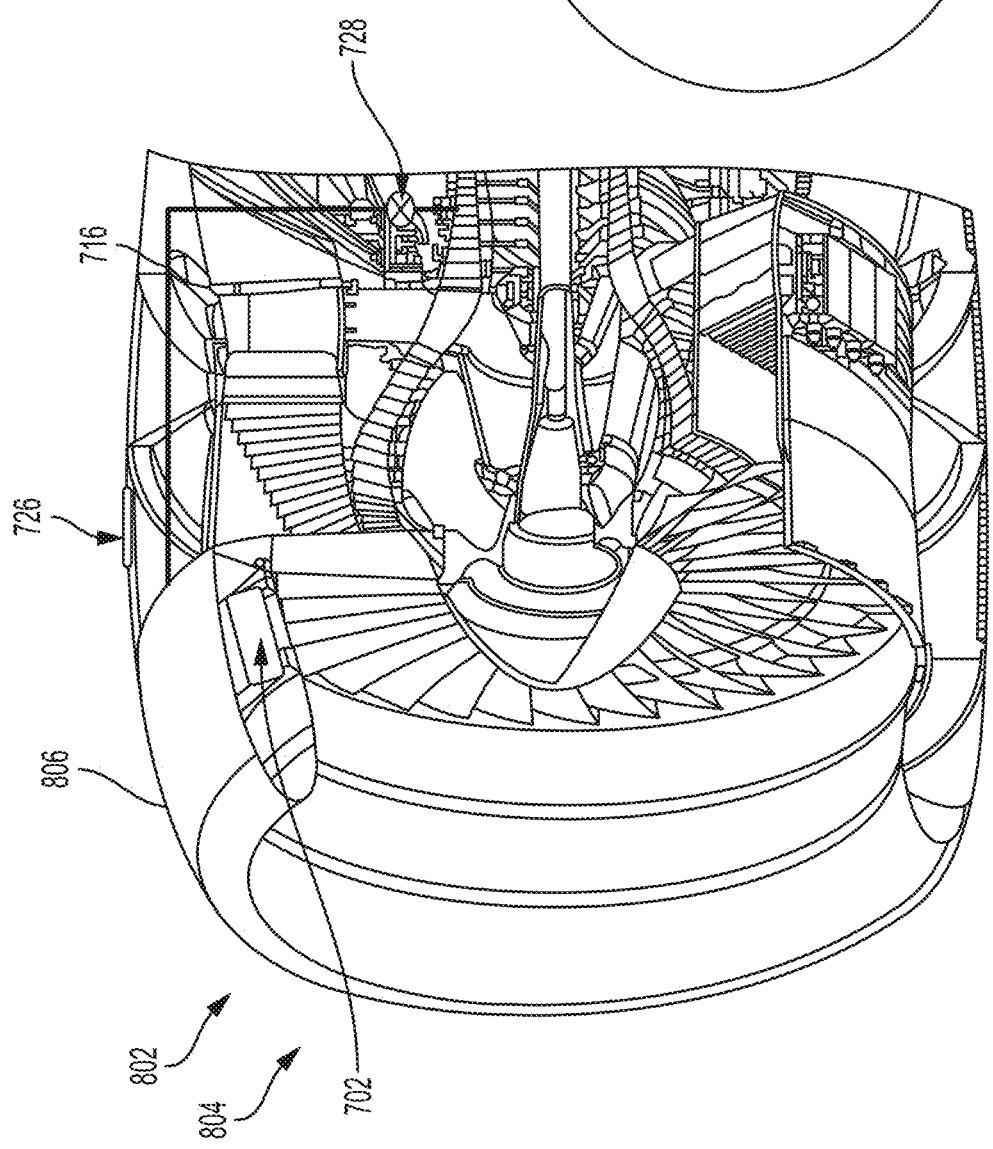
FIG. 7I is an illustration of integration of FIPS on an engine inlet, according to various examples.

FIG. 7I shows the integration of a FIPS with the engine inlet lip 800 defining a leading edge of a nacelle 802 of an aircraft engine 804. The anti-ice fluid 704 is pumped into the leading edge cavity (comprising pressurized composite tank 702) and secreted through the inlet lip 800 having porous panel comprising a porous metallic lipskin 806. The action of the freestream airflow causes the fluid 704 to run back on both the internal and external surfaces of the inlet, protecting the full leading edge and preventing the formation of run back ice. FIG. 7J illustrates the position of the tank 702 looking aft at the engine inlet, wherein the tank is positioned at 90 degrees from the top of the engine inlet.

Second Example: Porous Panel on and Engine Inlet

Figure 8:
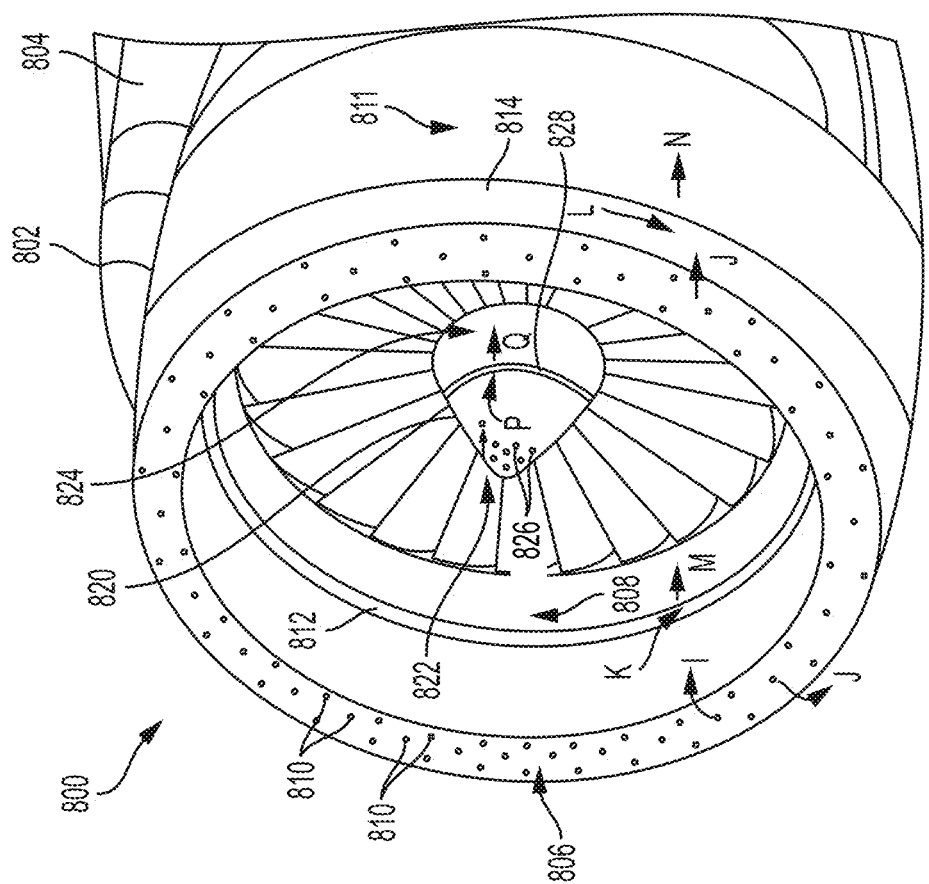
FIG. 8 is a front perspective view of a gas turbine engine and an engine nacelle with an anti-ice system according to various aspects.

FIG. 8 illustrates an anti-ice system according to various aspects on a gas turbine engine 800. The gas turbine engine includes a nacelle 802 mounted on a pylon 804. The pylon 804 could connect the nacelle 802 to a wing or fuselage of an aircraft, for example. The nacelle 802 includes a leading edge 806. The leading edge 806 includes a porous panel including a plurality of orifices 810, through which an ice protection fluid can weep out. The ice protection fluid weeping out of the orifices 810 can travel in the direction of arrow I toward an inward-facing downstream surface 808 of the nacelle 802 or in the direction of arrow J toward an outward-facing downstream surface 811 of the nacelle 802. The inward-facing downstream surface 808 of the nacelle 802 includes an aperture 812. The aperture 812 could be arranged as a continuous aperture or as a series of spaced-apart apertures. Ice protection fluid traveling toward the aperture 812 can be drawn into the aperture 812 in the direction of arrow K and water carried by the ice protection fluid can continue into the engine in the direction of arrow M. The outward-facing downstream surface 811 of the nacelle 802 includes an aperture 814. The aperture 814 could be arranged as a continuous aperture or as a series of spaced-apart apertures. Ice protection fluid traveling toward the aperture 814 can be drawn into the aperture 814 in the direction of arrow L and water carried by the ice protection fluid can continue aft in the direction of arrow N.

A spinner 820 for the gas turbine engine 800 can also include an anti-ice system. An array of orifices 826 for weeping the ice protection fluid onto the spinner, can be arranged on a first region 822 (e.g., an upstream region) of the spinner 820. An aperture 828 can be arranged on a second region 824 (e.g., a downstream region) of the spinner 820. The aperture 428 could be arranged as a continuous aperture or as a series of spaced-apart apertures. Ice protection fluid traveling from the orifices 426 (in the direction of arrow O) toward the aperture 428 can be drawn into the aperture 428 in the direction of arrow P and water carried by the ice protection fluid can continue into the engine in the direction of arrow Q.

In one or more examples, the engines used with the ice protection system (including the sensor for the ice protection fluid) are smaller and more efficient, thereby enabling more efficient and lighter aircraft. One or more examples of the ice protection system enable the use of engines with very high bypass ratios and small cores because anti-ice bleed flow is reduced or eliminated.

Third Example: Porous Panel on a Propeller or Jet Engine Fan

Figure 9:
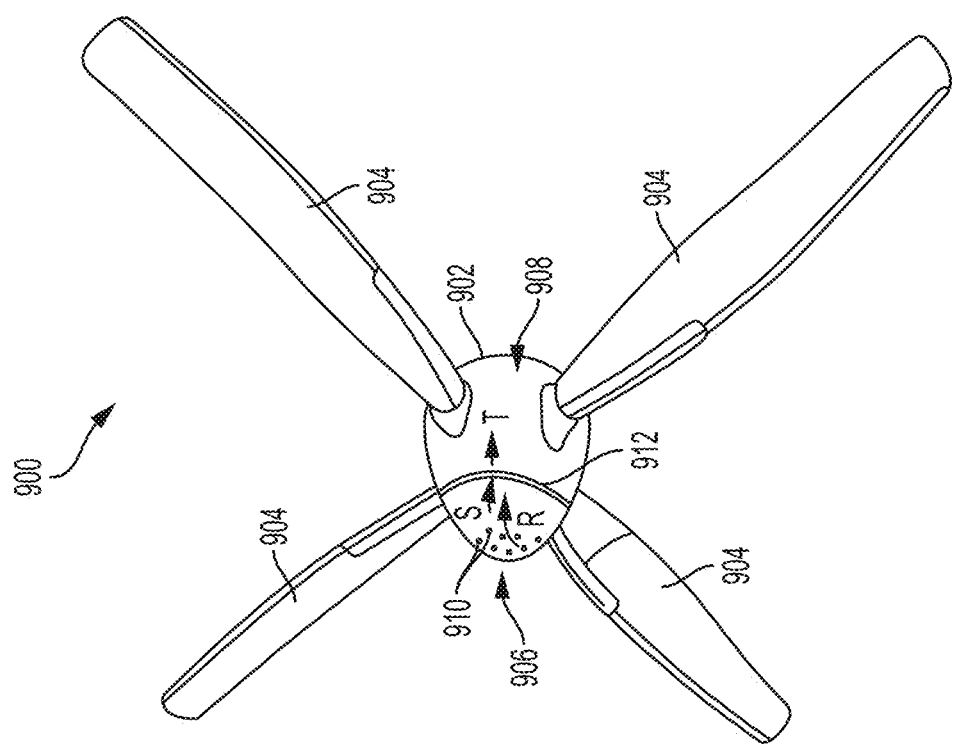
FIG. 9 is a front perspective view of a propeller and propeller spinner with an anti-ice system according to various aspects.

FIG. 9 illustrates an anti-ice system according to various aspects on an aircraft propeller 900. The propeller includes four propeller blades 904 extending from a spinner 902. An anti-ice system can be arranged for the spinner 902. An array of orifices 910, can be arranged on a first region 906 (e.g., an upstream region) of the spinner 902. An aperture 912 can be arranged on a second region 908 (e.g., a downstream region) of the spinner 902. The aperture 912 could be arranged as a continuous aperture or as a series of spaced-apart apertures. Ice protection fluid traveling from the orifices 910 (in the direction of arrow R) toward the aperture 912 can be drawn into the aperture 912 in the direction of arrow S and water carried by the ice protection fluid can continue toward the blades 904 the direction of arrow T.

In various examples, geared turbofan engines have fans that don't spin very fast. At some point they may spin slow enough that ice can form near the hub of the blade and an anti-ice system can be used to remove ice from the hub.

Figure 10:
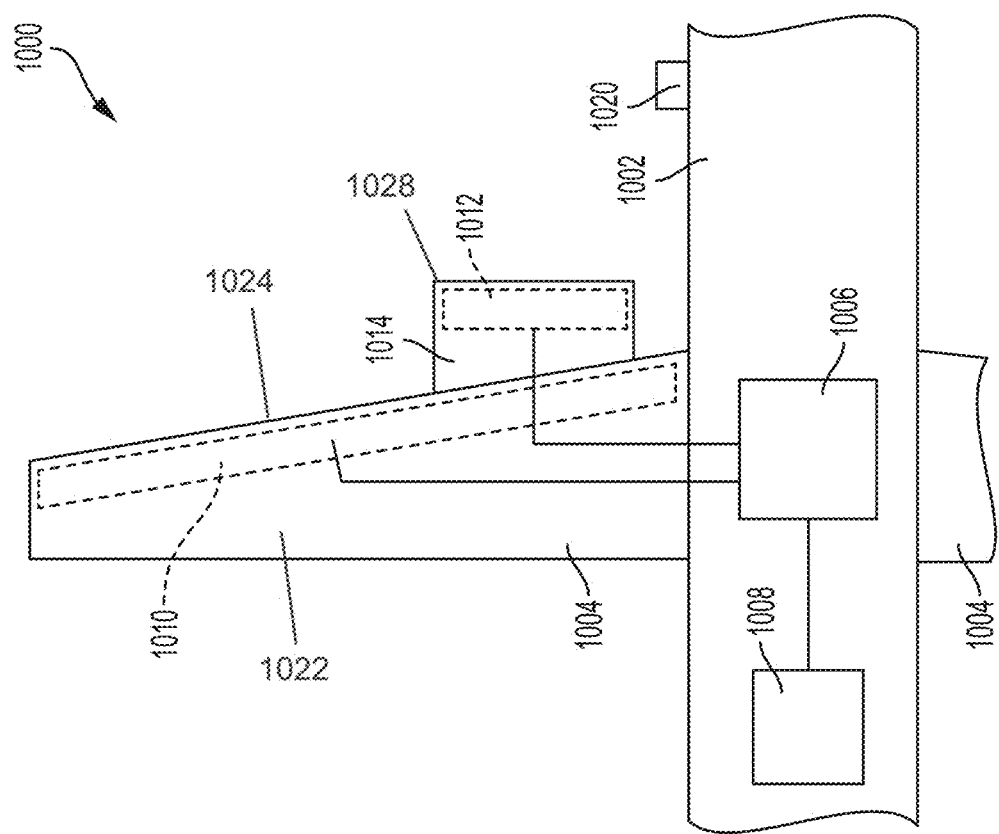
FIG. 10 is a top schematic view of an aircraft with an anti-ice system according to various aspects.

FIG. 10 is a schematic view of an aircraft 1000, illustrating a portion of the fuselage 1002 and the wings 1004 of the aircraft 1000. The aircraft includes a reservoir 1006 of ice protection fluid. The ice protection fluid can be provided to an anti-ice system 1010 in the wings 1004 of the aircraft 1000 and to an anti-ice system 1012 in engines 1014 of the aircraft 1000. The anti-ice system 1010 in the wings 1004 could draw ice protection fluid from the reservoir 1006, pass the ice protection fluid through orifices in a leading edge of the wing, recover at least some of the ice protection fluid through apertures in a downstream region of the wing, and return the ice protection fluid to the reservoir 1006.

In various aspects, the aircraft 1000 includes an icing detector 1020. The icing detector 1020 could be a sensor that detects the buildup of ice thereon. In various aspects, computer systems onboard the aircraft 1000 could monitor the icing detector 1020 and automatically activate the anti-icing systems 1010 and 1012 if icing and/or icing conditions are detected.

In various aspects, the computer systems 1008 (including processors) are communicatively connected to the flow meter and valve controlling the flow of the engine bleed air into the tank, wherein the one or more processors use the flow rate of the ice protection fluid to control the flow rate of the engine bleed air through the valves such that the porous panels are charged with ice protection fluid after starting the engine. In various aspects, the one or more processors use the flow rate of the anti-icing fluid to control the flow rate of the engine bleed air such that the ice protection fluid flows out of the porous panels onto the aerodynamic surface, removing and preventing ice build-up on the aerodynamic surface.

Figure 11:
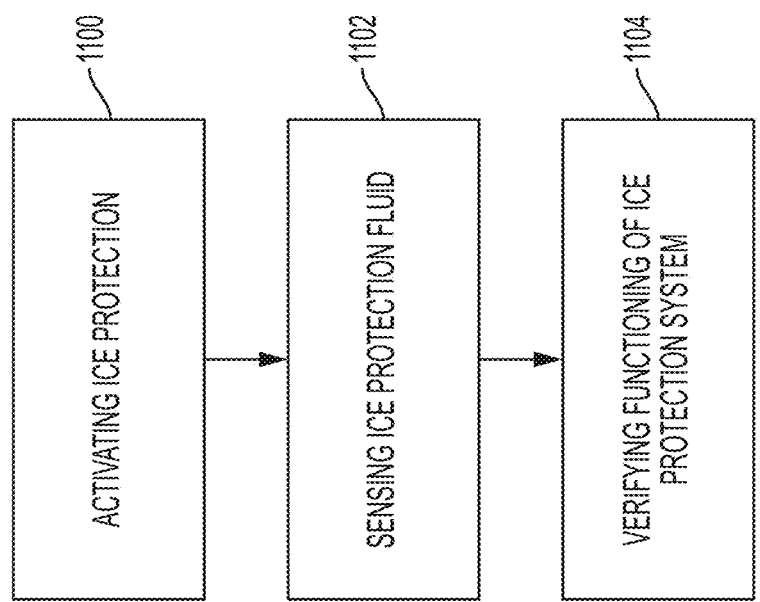
FIG. 11 is a flow chart illustrating a method for using an anti-ice system according to various aspects.

FIG. 11 is a flow chart that illustrates a method for operating an anti-ice system 106, 416 and detecting ice protection fluid 110, 402 on an aerodynamic surface 114, 1022 including, but not limited to, a wing 308, 1004 leading edge 1024, windshield, engine inlet 214, propeller 900, or tail 218 on an aircraft 1000 such as a civil aviation aircraft.

Block 1100 represents activating an ice protection system 106, 416 delivering ice protection fluid 110, 402 to the ice prone surface 102, 202 of the aerodynamic surface 114, 1022.

Block 1102 represents sensing a presence of the ice protection fluid 110, 402 and/or an additive 130, 404 in an ice protection fluid 110, 402 on the ice-prone surface 102, 202. In various examples, sensing the additive 130, 404 indicates a presence of ice protection fluid 110, 402 on the ice-prone surface 102, 202. In one example, the additive includes suspended particulates 126, 400, 400b that reflect a specific wavelength of a LIDAR beam 128 back to a LIDAR system 108, so that the LIDAR system 108 measures the presence of the ice protection fluid 110, 402. In another example, the sensing detects a conductivity C and/or a magnetic property M of the ice protection fluid 110, 402 to indicate presence of the ice protection fluid 110, 402. The ice protection fluid 110, 402 includes metal particles 400, 400b that modify a conductivity C and/or a magnetic property M of the ice protection fluid 110, 402, wherein the sensor indicates the presence of the ice protection fluid 110, 402 by sensing a change in conductivity C and/or magnetic field M1 measured by the sensor. In one example where the metal particles 400, 400b are iron particles, a magnet is used to detect the fluid. In another example where the particles 400, 400b are made of other metals, such as, but not limited to, silver or gold, a metal detector 410 is used to sense the particles 400 and detect the ice protection fluid 402.

In various examples, the sensor emits and senses RADAR, Microwave, or Millimeter Wave signals S. Some wavelengths can punch through moisture better, or allow for different antennas/detectors. For instance, millimeter wave reflectors could be applied to the protected surface or an ice prone surface 102, 202. When the fluid 110, 402 is flowing, the fluid (e.g., ice protection fluid 110, 402) disrupts the reflectors so the return signal to a transceiver is knocked way down.

Block 1104 represents using the sensor 104, 408, 604 output to indicate, determine, or verify whether the anti-ice or ice protection system 106, 416 is functioning properly and applying ice protection fluid 110, 402 correctly. The sensor system provides a built in test that the anti-ice system 106, 416 is functioning.

In one or more examples, the sensor includes sensing elements 412 distributed on the ice-prone surface 102, 202 such that one or more of the following can be detected and determined: blockage in the flow F of fluid 110, 402 (e.g., blockage in the porous panel 706 from particulates), the flow rate R of the ice protection fluid 110, 402, ice formation 1026, weeping of the ice protection fluid 110, 402, from different sections of a porous panel 706 and onto the ice prone surface 102, 202 (indicating sections of the porous panel in anti ice system 1012, 1010 that are not functioning), unwanted leakage of ice protection fluid 110, 402 from the porous panel 706 in anti ice system 1012, 1010, verification that ice protection fluid 110, 402 is flowing correctly/ everywhere needed, functioning of the flow meter 718 indicating the flow of the ice protection fluid 110, 402 in the anti-icing system 1012, 110. In one instance, signal conditioning of the sensor signal 502 is used to estimate a flow rate R of the ice protection fluid 110, 402.

In one example, the sensor output is used to ensure that various ice prone surfaces 102, 202, are being anti-iced. In another example, the sensor output 502 is used to determine whether water (e.g., rain water) or ice protection fluid 110, 402 is flowing. In yet another example, if the fluid ice protection system 1012, 1010 is activated and the sensor 104, 408, 604 system does not detect ice protection fluid 110, 402 within a specified time, the ice protection system 1012, 1010 activates an alert on the flight deck 1300 such as sending the flight crew a warning (e.g., an EICAS message). The flight crew can then attempt a flight level change or change course to find non-icing flight conditions. In yet another example, a maintenance message is sent to request repair of the ice protection system 1012, 1010.

In another example, indication of the presence or absence of ice protection fluid 110, 402 by the sensor 104, 408, 604 is used to adjust the flow F of ice protection fluid 110, 402 provided by the anti-icing system 1012, 1010. For example, the proper amount of ice protection fluid 110, 402 is applied or removed from leading edge 1024, 1028 of the inlet 800 or wings 1010 in response to the sensor indication.

In yet another example, if the sensor 104, 408, 604 indicates leakage around the leading edge 1024, 1028 of the engine inlet 800 or wings 1010, and the flow meter 718 is still pumping fluid 110, 402 but the sensor 104, 408, 604 detects no ice protection fluid 110, 402 is flowing F on the ice prone surfaces 102, 202, then a determination has to be made if the flow meter 718 is not functioning properly or if the porous panel 706 in system 1010, 1012 is blocked. In various examples, the sensor 104, 408, 604 could set a maintenance flag indicating to the maintenance crew where/ what needs to be checked.

In an example where unwanted leakage is detected, the ice protection fluid 110, 402 is suctioned out of the porous panel 706 in anti-ice system 1010, 1012 (e.g., using the eductor 712).

In yet another example, the use of the sensor 104, 408, 604 system reduces engine 708 power extraction by more than 98% and reduces airplane weight for the anti-ice system 1010, 1012 by more than 80%.

In a further example, visual inspection to verify the presence of ice protection fluid 110, 402 is unnecessary and is not performed.

In yet a further example, the anti-icing system 1010, 1012 and sensor 104, 408, 604 system are operated anytime the engine 708 is running and fluid 110, 402 flows into the engine. However, the sensor 104, 408, 604 system can be operated when aircraft 1000 is in motion (e.g., fluid 110, 402 into and over the engine 708) or when the aircraft 1000 is stationary.

Other aspects may also be used to prevent ice accumulation on other craft, including, but not limited to, military aircraft, rotorcraft, and UAVs, or on cold, condensing surfaces where atmospheric air cause ice formation, such as on terrestrial auxiliary heat exchangers used in nitrogen recovery systems and cryogenic fuel tanks such as those used on launch vehicles.

FIPS Impact on Weight and Power Extraction, According to One or More Examples

In various examples, the FIPS offers a promising low-temperature, low-pressure anti-ice alternative which avoids the weight, complexity and power demands of a thermally-based system reliant on pneumatic or electrical heat transmission. Such a system decouples EAI from engine power extraction through either bleed or horse-power, and enables a decrease in core size for a MB engine. In various examples, the FIPS has power requirements reduced by orders of magnitude as compared to an anti-ice pneumatic swirl system as illustrated in FIG. 12.

Figure 12:
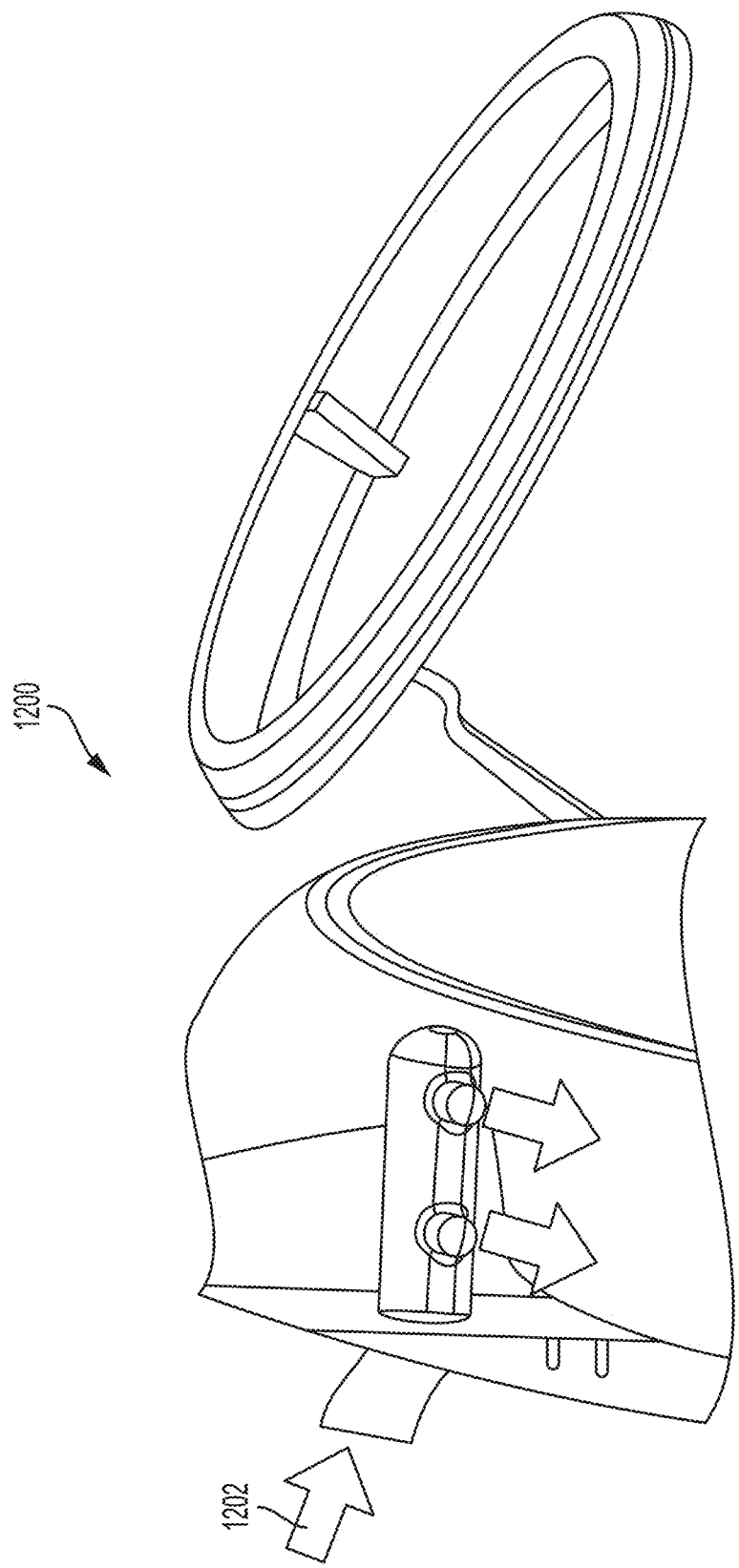
FIG. 12 is an illustration of anti-ice bleed air systems using thermal energy from the bleed air to melt ice on the engine.

In the bleed air system of FIG. 12, ice protection is provided by a pneumatic swirl system utilizing hot bleed air from the engine core. A small percentage of the core mass flow is extracted between compressor stages, and transferred to a 'D-duct' formed by the inner surface of the nacelle lip and the upstream surface of the forward bulk-head. Such systems provide ice protection via thermal flux through the nacelle lipskin and are about 50% efficient, with roughly half of the energy in the high pressure, high temperature bleed air transferred through the metallic lip and about half remaining in the overboard exhaust.

In various examples, the FIPS system may enable ultra high bypass ratio engines having reduced engine core size and less thrust required when the FIPS is operating during descent over a pneumatic system.

Figure 13:
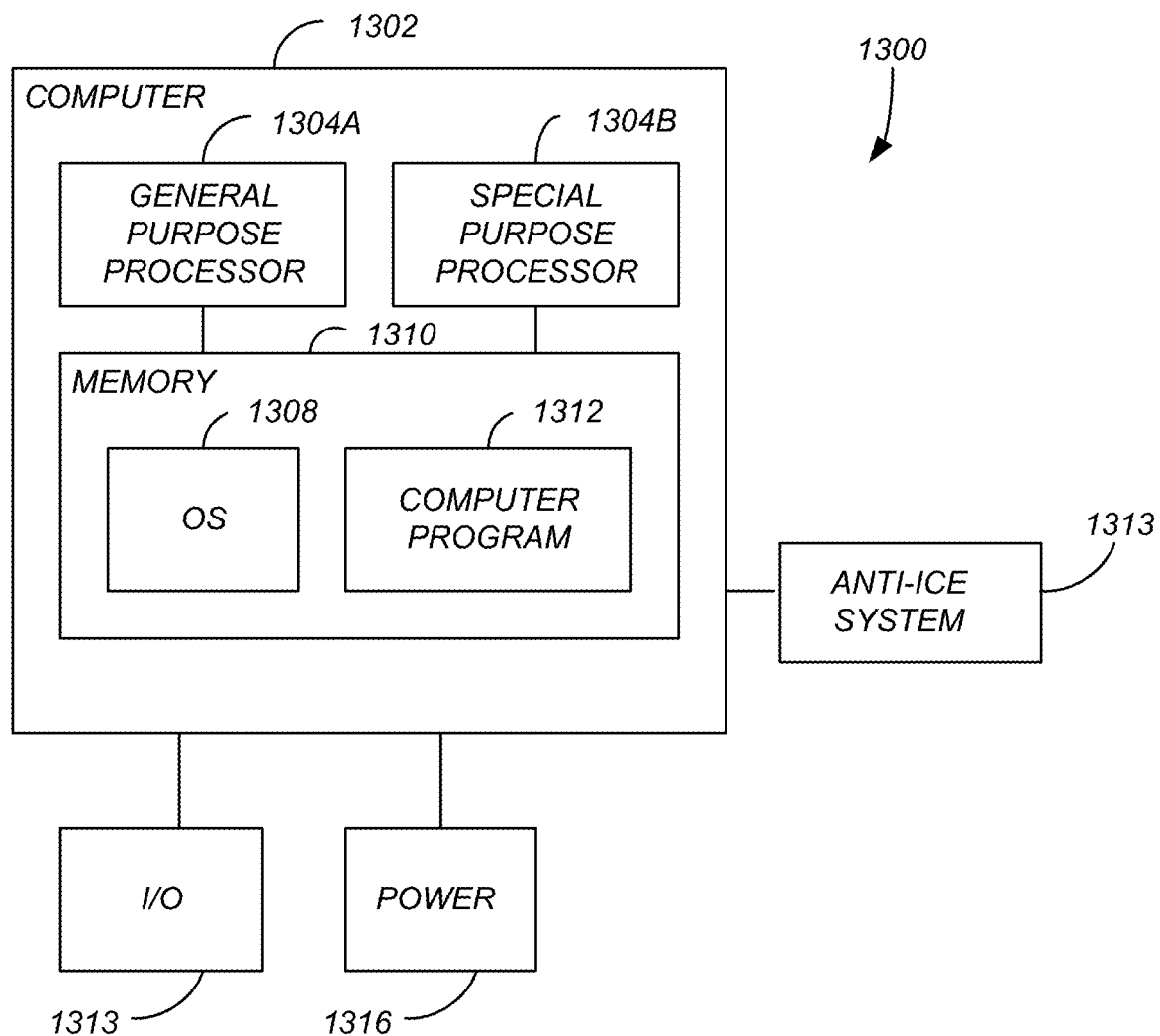
FIG. 13 illustrates a processing environment for processing data from the sensors and/or activating the anti-ice system.

The descriptions of the various aspects have been presented for purposes of illustration, but are not intended to be exhaustive or limited to the aspects disclosed. Many modifications and variations will be apparent to those of ordinary skill in the art without departing from the scope and spirit of the described aspects. The terminology used herein was chosen to best explain the principles of the aspects, the practical application or technical improvement over technologies found in the marketplace, or to enable others of ordinary skill in the art to understand the aspects disclosed herein.

Processing Environment FIG. 13 illustrates an exemplary system 1300 comprising a computer 1302 that could be used to implement processing elements needed to process the sensor 104, 206, 304, 502 (e.g., indicate the presence of ice protection fluid 110, 402, 610 from the LIDAR 108, metal detector 408, or conductivity sensor 604 output), activate/deactivate the anti-ice system 106, and/or be used as a flight deck indication system. The computer 1302 is typically located on the aircraft.

The computer 1302 comprises a processor (comprising general purpose processor 1304A and special purpose processor 1304B) and a memory, such as random access memory (RAM) 1306. Generally, the computer 1302 operates under control of an operating system 1308 stored in the memory 1306, and interfaces with the user to accept inputs and commands (analog or digital signals) and to present results through an input/output module 1310. The computer program application 1312 accesses and manipulates data stored in the memory 1306 of the computer 1302. The operating system 1308 and the computer program 1312 are comprised of instructions which, when read and executed by the computer 1302, cause the computer 1302 to perform the operations herein described. In one embodiment, instructions implementing the operating system 1308 and the computer program 1310 are tangibly embodied in the memory 1306, thereby making a computer program product or article of manufacture. As such, the terms "article of manufacture," "program storage device" and "computer program product" as used herein are intended to encompass a computer program accessible from any computer readable device or media.

In one embodiment, computer 1302 comprises one or more field programmable gate arrays (FPGAs).

In one embodiment, the computer 1302 receives a signal through I/O 1310 from the sensor. In response, the computer 1302 calculates the presence of ice protection fluid on the aerodynamic surface, activates/deactivates the anti ice system 106, and/or alerts the flight crew when the ice detector detects ice. The flight crew may turn on or deactivate the anti-ice system 106 and/or move the airplane out of the icing condition in response to the flight deck indication.

FIG. 13 further illustrates a power source 1316 for providing power to the system 1300.

Those skilled in the art will recognize many modifications may be made to this configuration without departing from the scope of the present disclosure. For example, those skilled in the art will recognize that any combination of the above components, or any number of different components, peripherals, and other devices, may be used.

While the foregoing is directed to aspects of the present invention, other and further aspects of the invention may be devised without departing from the basic scope thereof, and the scope thereof is determined by the claims that follow.

What is claimed is:

1. A system for anti-icing an ice prone surface of an aircraft, comprising:
a sensor sensing presence of ice-protection fluid including an additive on an ice prone surface of an aircraft, wherein:
the additive comprises at least one of:
metal particles, or
suspended particulates which modify a magnetic property of the ice-protection fluid or whose presence is measured from a backscattering from the ice-prone surface; and
the sensing comprises sensing the magnetic property or the backscattering; and
an anti-icing system on the ice prone surface regulating flow rate of the ice-protection fluid on the ice prone surface based on input from the sensor regarding the presence of the ice-protection fluid.

2. The system of claim 1, wherein the sensor comprises a Light Detection and Ranging (LIDAR) system emitting a LIDAR beam and the backscattering comprises a reflection from the particulates.

3. The system of claim 1, further comprising a control system operating the sensor during flight of the aircraft.

4. The system of claim 2, wherein:
the LIDAR system comprises one or more transmitters transmitting the LIDAR beam and one or more receivers receiving the LIDAR beam, and
the transmitters and the receivers are flush mounted along the ice-prone surface.

5. The system of claim 2, wherein the aircraft comprises a fuselage and the LIDAR system is mounted in the fuselage and the LIDAR system emits the LIDAR beam sweeping the ice prone surface to measure the presence of the ice-protection fluid, and the LIDAR system measures a presence of the additive comprising the suspended particulates in the ice-protection fluid from the backscattering comprising LIDAR backscatter in order to detect the ice-protection fluid.

6. The system of claim 1, wherein the sensor is a metal detector sensing flow of the additive comprising the metal particles in the ice-protection fluid.

7. The system of claim 6, wherein:
the metal particles comprise iron in a ferrofluid added to the ice-protection fluid, and
the metal detector comprises a magnetic field sensor sensing a change in a magnetic field due to the metal particles.

8. The system of claim 6, wherein:
the metal detector comprises sensing elements integrated on a porous panel on the ice-prone surface,
the porous panel comprises a weeping portion from which the ice-protection fluid weeps onto the ice-prone surface to remove or prevent ice build-up on the ice-prone surface, and
the sensing elements are positioned downstream from the weeping portion.

9. The system of claim 6, wherein:
the metal particles comprise iron in a ferrofluid added to the ice-protection fluid, and
the sensing elements comprise wire loops printed onto an inside of a porous panel, the porous panel distributing ice-protection fluid onto the ice-prone surface to remove or prevent ice build-up on the ice-prone surface, and
the wire loops sensing a change in magnetic field due to flow of the iron in the ice protection fluid.

10. The system of claim 6, wherein the metal particles are nanoparticles distributed homogenously in the ice-protection fluid.

11. The system of claim 1, wherein the sensor comprises:
electrical contact pairs having their circuit closed when the ice-protection fluid makes an electrical Pathway between them.

12. The system of claim 11, wherein the electrical contact pairs measure impedance and/or voltage between two contact points on the ice-prone surface to differentiate the ice-protection fluid from water flowing on the ice-prone surface.

13. The system of claim 12, wherein the ice-protection fluid comprises the additive comprising the metal particles that increase conductivity of the ice-protection fluid.

14. The system of claim 1, further comprising an alert system activated when the anti-icing system is activated and the sensor does not detect the ice-protection fluid to a target level within a specified period of time, so that a non-icing flight condition can be found.

15. The system of claim 1, wherein:
the anti-icing system comprises a flow meter indicating a flow of the ice: protection fluid, and
the sensor comprises sensing elements distributed on the ice-prone surface such that one or more of the following can be detected:
blockage in the flow and the flow rate of the ice-protection fluid,
weeping of the ice-protection fluid from different sections of a porous panel and onto the ice prone surface,
unwanted leakage of ice-protection fluid from the porous panel, and
functioning of the flow meter.

16. The system of claim 15, further comprising an eductor evacuating ice: protection fluid from the porous panel using engine bleed air when the unwanted leakage is detected.

17. The system of claim 1, wherein the ice prone surface is a leading edge of a wing, a tail, or an engine inlet on the aircraft.

18. The system of claim 1, wherein the sensor comprises RADAR, Microwave, or Millimeter Wave signals.

19. A method of verifying functioning of an anti-icing system on an ice prone surface of an aircraft, comprising:
sensing a presence of ice-protection fluid on the ice prone surface of the aircraft with a sensor, wherein the sensor comprises sensing elements distributed on the ice prone surface such that one or more of the following can be detected:
a blockage in a flow and a flow rate of the ice-protection fluid,
weeping of the ice-protection fluid from different sections of a porous panel and onto the ice prone surface, or
unwanted leakage of ice-protection fluid from the porous panel; and
verifying functioning of the anti-icing system on the ice prone surface based on input from the sensing.

20. The method of claim 19, wherein the sensing detects at least one of a conductivity property, a magnetic property, or a backscattering of an additive in the ice-protection fluid to sense the presence of the ice protection fluid during flight of the aircraft.

* * * * *